United States Patent
Pyun et al.

(10) Patent No.: US 11,875,740 B2
(45) Date of Patent: Jan. 16, 2024

(54) DISPLAY DEVICE AND METHOD OF DRIVING THE SAME

(71) Applicant: SAMSUNG DISPLAY CO., LTD., Yongin-si (KR)

(72) Inventors: Ki Hyun Pyun, Yongin-si (KR); Hee Sook Park, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/566,407

(22) Filed: Dec. 30, 2021

(65) Prior Publication Data

US 2022/0262307 A1 Aug. 18, 2022

(30) Foreign Application Priority Data

Feb. 16, 2021 (KR) ........................ 10-2021-0020739

(51) Int. Cl.
*G09G 3/3233* (2016.01)
*G09G 3/00* (2006.01)
*H10K 50/115* (2023.01)

(52) U.S. Cl.
CPC .......... *G09G 3/3233* (2013.01); *G09G 3/006* (2013.01); *H10K 50/115* (2023.02); *G09G 2310/08* (2013.01); *G09G 2320/041* (2013.01); *G09G 2330/12* (2013.01); *G09G 2340/045* (2013.01)

(58) Field of Classification Search
CPC .. G09G 3/3233; G09G 3/006; G09G 2310/08; G09G 2320/041; G09G 2330/12; G09G 2340/045; H01L 51/502
See application file for complete search history.

(56) References Cited

U.S. PATENT DOCUMENTS

| | | | |
|---|---|---|---|
| 6,859,193 | B1 | 2/2005 | Yumoto |
| 9,236,011 | B2 | 1/2016 | Mizukoshi |
| 9,324,264 | B2 | 4/2016 | Jeong et al. |
| 9,373,280 | B2 | 6/2016 | Yoon et al. |
| 2007/0171159 | A1* | 7/2007 | Lee ........................ H05B 45/28 345/83 |
| 2017/0213493 | A1* | 7/2017 | Han ...................... G09G 3/3208 |
| 2018/0158423 | A1* | 6/2018 | Kim ...................... G09G 3/3688 |
| 2020/0027393 | A1* | 1/2020 | Tang ...................... G09G 3/3225 |
| 2021/0351369 | A1* | 11/2021 | Peng ...................... H01L 51/502 |

FOREIGN PATENT DOCUMENTS

| | | |
|---|---|---|
| KR | 10-0861756 | 9/2008 |
| KR | 10-0888004 | 3/2009 |
| KR | 10-1908513 | 10/2018 |
| KR | 10-1992904 | 6/2019 |
| KR | 10-2167102 | 10/2020 |

\* cited by examiner

*Primary Examiner* — Matthew A Eason
*Assistant Examiner* — Sujit Shah
(74) *Attorney, Agent, or Firm* — F. Chau & Associates, LLC

(57) ABSTRACT

A display device includes a display panel including a plurality of pixels and partitioned into a plurality of blocks including at least one of the pixels, a timing controller configured to receive input image data from an outside source and generate scaled image data by scaling the input image data using a scale factor, a data driver configured to generate a data signal corresponding to the scaled image data and supply the data signal to the pixels, and a logic circuit configured to generate the scale factor based on the input image data, first weight data, and second weight data different from the first weight data.

28 Claims, 11 Drawing Sheets

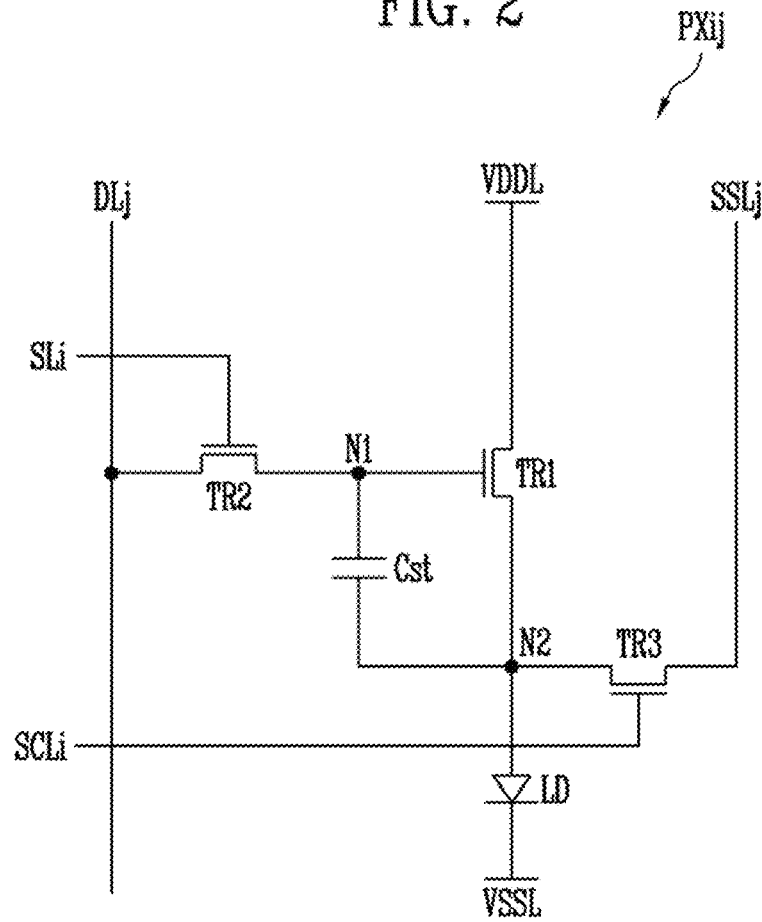

FIG. 3A
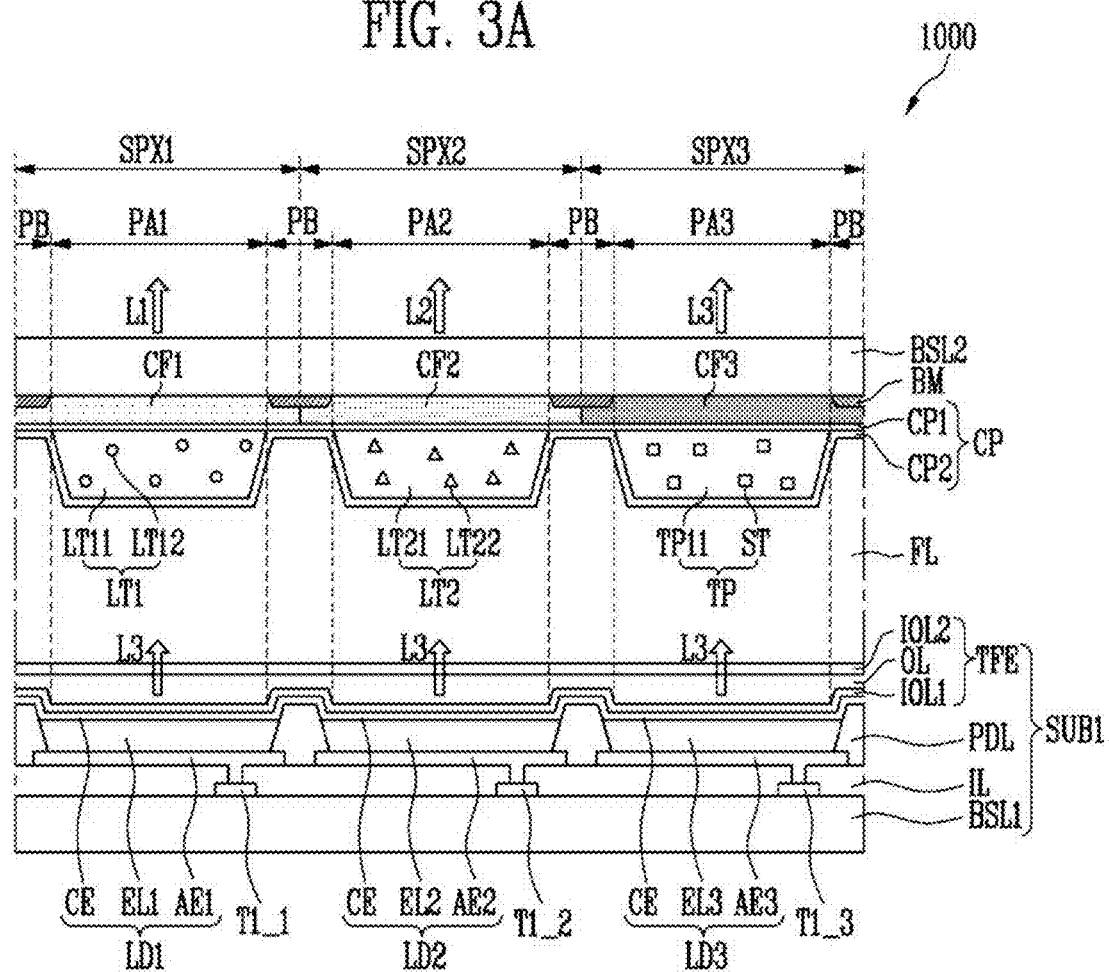
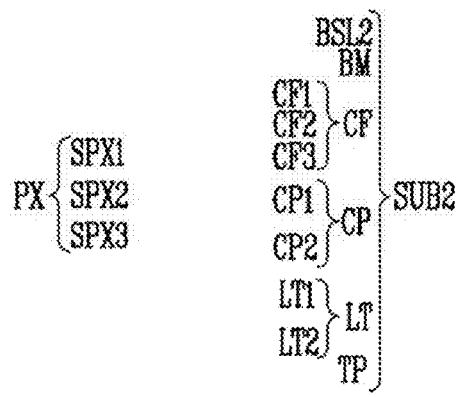

| Age | LUMINANCE MAINTENANCE RATE |
|---|---|
| 0 | 1 |
| 4 | 0.998401 |
| 8 | 0.996805 |
| 12 | 0.995212 |
| 16 | 0.99362 |
| ⋮ | ⋮ |
| 1020 | 0.664979 |
| 1024 | 0.663916 |

<LUT4>

| BLK11 | BLK12 | BLK13 | BLK14 | BLK15 |
| BLK21 | BLK22 | BLK23 | BLK24 | BLK25 |
| BLK31 | BLK32 | BLK33 | BLK34 | BLK35 |

DISPLAY DEVICE AND METHOD OF DRIVING THE SAME

CROSS REFERENCE TO RELATED APPLICATIONS

The non-provisional U.S. patent application claims priority under 35 U.S.C. § 119(a) to Korean Patent Application No. 10-2021-0020739, filed Feb. 16, 2021, the disclosure of which is incorporated by reference in its entirety herein.

1. TECHNICAL FIELD

The disclosure relates to a display device and a method of driving the same.

2. DISCUSSION OF RELATED ART

A flat panel display (FPD) is an electronic viewing technology used to enable people to see content (e.g., still or moving images). An FPD is lighter, thinner, and uses less power than a traditional cathode ray tube (CRT) display. Examples of an FPD include a liquid crystal display device and an organic light emitting display device.

A display panel of an FPD device includes pixels, and image frames displayed by the pixels may have different load values. For example, an image frame corresponding to a bright image may have a large load value, and an image frame corresponding to a dark image may have a small load value.

According to a load value, a target current amount required by the pixels may be different. Accordingly, an appropriate target current is required to be supplied to the pixels in correspondence with the load value of the image frame. However, a current amount flowing through a driving transistor included in the pixels and efficiencies of the sub pixels included in each of the pixels may change according to a change in ambient temperature of the display panel.

Therefore, a display device is required to compensate for the target current amount in consideration of characteristics of the pixels which change in correspondence with the ambient temperature change.

SUMMARY

At least one embodiment of the disclosure provides a display device capable of displaying an image with a preset target luminance regardless of an ambient temperature change of a display panel, and a method of driving the same.

According to an embodiment of the disclosure, a display device includes a display panel, a timing controller, a data driver, and a first logic circuit. The display panel includes a plurality of pixels and partitioned into a plurality of blocks including at least one of the pixels. The timing controller us configured to receive input image data from an outside source and generate scaled image data by scaling the input image data using a scale factor. The data driver is configured to generate a data signal corresponding to the scaled image data and supply the data signal to the pixels. The first logic circuit is configured to generate the scale factor based on the input image data, first weight data, and second weight data different from the first weight data.

The first logic circuit may include a current sensor configured to measure a current flowing through the pixels and generate a global current value, a first calculator configured to generate a unit target current value based on the global current value corresponding to a reference block among the blocks, a second calculator configured to generate a load value for each of the blocks, based on the input image data, a third calculator configured to generate temperature data for each of the blocks, based on the load value for each block, a fourth calculator configured to calculate a frame load value based on the load value for each block, the first weight data, and the second weight data, and to generate a target current value based on the frame load value and the unit target current value, and a second logic circuit configured to calculate the scale factor by comparing the target current value and the global current value.

The scale factor may be a ratio between the target current value and the global current.

Each of the pixels may include a first sub pixel emitting light in a first color, a second sub pixel emitting light in a second color, and a third sub pixel emitting light in a third color.

The first sub pixel may include a light emitting diode emitting light in the third color, and a first wavelength conversion pattern that converts the light of the third color into the light of the first color, the second sub pixel may include a light emitting diode emitting light in the third color, and a second wavelength conversion pattern that converts the light of the third color into the light of the second color, and the third sub pixel may include a light emitting diode emitting light in the third color, and a light transmission pattern that allows the light of the third color to transmit.

The first color may be red, the second color may be green, the third color may be blue, the first wavelength conversion pattern may include a first quantum dot, and the second wavelength conversion pattern may include a second quantum dot having a size less than a size of the first quantum dot.

The first quantum dot and the second quantum dot may be semiconductor nano crystalline materials including any one of group IV group nano crystal, II-VI group compound nano crystal, III-V group compound nano crystal, and IV-VI group nano crystal, or a combination thereof.

The first wavelength conversion pattern, the second wavelength conversion pattern, and the light transmission pattern may further include a scattering body that scatters the transmitted light.

The first logic circuit may further include at least one of a fifth calculator configured to generate a maximum grayscale value for each of the first sub pixel, the second sub pixel, and the third sub pixel included in each of the blocks based on the input image data, and a sixth calculator configured to calculate a life of the display panel to generate life data.

The display device may further include a temperature sensor configured to measure an ambient temperature of the display panel to generate temperature data.

The third calculator may generate the temperature data for each block, based on the load value for each block, and at least one of the maximum grayscale value for each block, the temperature data, and the life data.

The fourth calculator may receive the first weight data from a second lookup table in which a first weight for a current characteristic of the pixels corresponding to a temperature of the display panel is stored, and receive the second weight data from a third lookup table in which a second weight for an efficiency characteristic of the pixels corresponding to the temperature of the display panel is stored.

The first weight may have a value of 1 at to first temperature, and a value linearly decreasing from the first temperature to a preset second temperature higher than the first temperature.

The second weight data may include third weight data for a first sub pixel, fourth weight data for the second sub pixel, and fifth weight data for the third sub pixel, the third weight data may have a value of 1 at the first temperature and a value linearly increasing from the first temperature to the second temperature, the fourth weight data may have a value of 1 at the first temperature and a value linearly decreasing from the first temperature to the second temperature, and the fifth weight data may be 1.

An increase rate of the third weight data may be greater than a decrease rate of the fourth weight data.

The frame load value may be frame load value= (IDATA_RGV*W1+IDATA_RGV*W21)/2+ (IDATA_GGV*W1+IDATA_GGV*W22)/2+ (IDATA_BGV*W1+IDATA_BGV*W23)/2, where IDATA_RGV is a first sub pixel load value of the input image data, IDATA_GGV is a second sub pixel load value of the input image data, IDATA_BGV is a third sub pixel load value of the input image data, W1 is the first weight data, W21 is the second weight data, W22 is the third weight data, and W23 is the fourth weight data.

According to an embodiment of the disclosure, a method of driving a display device is provided. The display device includes a display panel including a plurality of pixels and partitioned into a plurality of blocks including at least one of the pixels, a timing controller configured to receive input image data from an outside source and generate scaled image data by scaling the input image data using a scale factor, and a data driver configured to generate a data signal corresponding to the scaled image data and supply the data signal to the pixels. The method includes measuring a current flowing through the pixels to generate a global current value, generating a unit target current value based on the global current value corresponding to a reference block among the blocks, generating a load value for each of the blocks, based on the input image data, generating temperature data for each of the blocks, based on the load value for each block, calculating a frame load value based on the load value for each block, first weight data, and second weight data, generating a target current value based on the frame load value and the unit target current value, and calculating the scale factor by comparing the target current value and the global current value.

Each of the pixels may include a first sub pixel emitting light in a first color, a second sub pixel emitting light in a second color, and a third sub pixel emitting light in a third color.

Generating the temperature data for each block may further include at least one of generating a maximum grayscale value for each of the first sub pixel, the second sub pixel, and the third sub pixel included in each of the blocks based on the input image data, generating temperature data by measuring an ambient temperature of the display panel, and calculating a life of the display panel to generate life data.

According to an embodiment of the disclosure, a display device includes a display panel, a timing controller, and a data driver. The display panel includes a plurality of pixels. The timing controller is configured to generate compensated image data obtained by compensating for a luminance change according to a temperature of the plurality of pixels, based on input image data received from an outside source, and a data driver configured to generate a data signal corresponding to the compensated image data and supply the data signal to the pixels.

Each of the pixels emits light in different colors and includes at least two or more sub pixels including quantum dots different from each other, and the timing controller generates the image data in correspondence with a light emission efficiency characteristic according to a temperature of the quantum dot.

Each of the pixels may include a first sub pixel including a first quantum dot and a second sub pixel including a second quantum dot.

Each of the pixels may further include a third sub pixel including a scattering body.

The timing controller may generate the compensated image data in correspondence with a light emission efficiency characteristic according to a temperature of the first quantum dot and a light emission efficiency characteristic according to a temperature of the second quantum dot.

In the first sub pixel, when the temperature increases between a first temperature and a preset second temperature higher than the first temperature, the luminance may decrease according to the light emission efficiency characteristic according to the temperature of the first quantum dot. In the second sub pixel, when the temperature increases between the first temperature and the second temperature, the luminance may increase according to the light emission efficiency characteristic according to the temperature of the second quantum dot. In the third sub pixel, the luminance may be maintained constant regardless of the temperature change between the first temperature and the second temperature.

The display panel may be divided into blocks including at least one of the pixels, and the timing controller may calculate load values for each block for each of the first to third sub pixels, based on the input image data, and calculate the temperature for each of the first to third sub pixels, based on the load values for each block.

The display device may further include a temperature sensor configured to measure the ambient temperature of the display panel to calculate the temperature.

The timing controller may generate the compensated image data based on a current characteristic according to a temperature of the pixels, and in the pixels, when the temperature increases between the first temperature and the second temperature, the luminance may increase according to the current characteristic.

The timing controller may assign a first weight corresponding to the current characteristic and a second weight corresponding to the light emission efficiency characteristic according to the temperature of the first quantum dot to a sum of a load value for each block of the first sub pixels, assign the first weight and a third weight corresponding to the light emission efficiency characteristic according to the temperature of the second quantum dot to a sum of a load value for each block of the second sub pixels, and assign the first weight and a fourth weight to a sum of a load value for each block of the third sub pixels, to calculate a frame load value, and may generate the compensated image data corresponding to the frame load value.

The first weight may have a value of 1 at the first temperature and a value linearly decreasing from the first temperature to the second temperature.

The second weight may have a value of 1 at the first temperature and a value linearly increasing from the first temperature to the second temperature, the third weight may have a value of 1 at the first temperature and a value linearly decreasing from the first temperature to the second temperature, and the fourth weight may be 1.

An increase rate of the second weight may be greater than a decrease rate of the third weight.

In an embodiment of the disclosure, a display device and the method of driving the same display an image with a preset target luminance regardless of an ambient temperature change, by calculating a target current value based on weight data according to a current characteristic of pixels for each ambient temperature of the display panel and weight data according to an efficiency characteristic of the pixels for each ambient temperature.

BRIEF DESCRIPTION OF THE DRAWINGS

The disclosure will become more apparent by describing in further detail embodiments thereof with reference to the accompanying drawings, in which:

FIG. 2 is a circuit diagram illustrating an example of a pixel included in the display device of FIG. 1;

FIG. 3A is a cross-sectional view of a pixel according to an embodiment;

DETAILED DESCRIPTION

Figure 1:
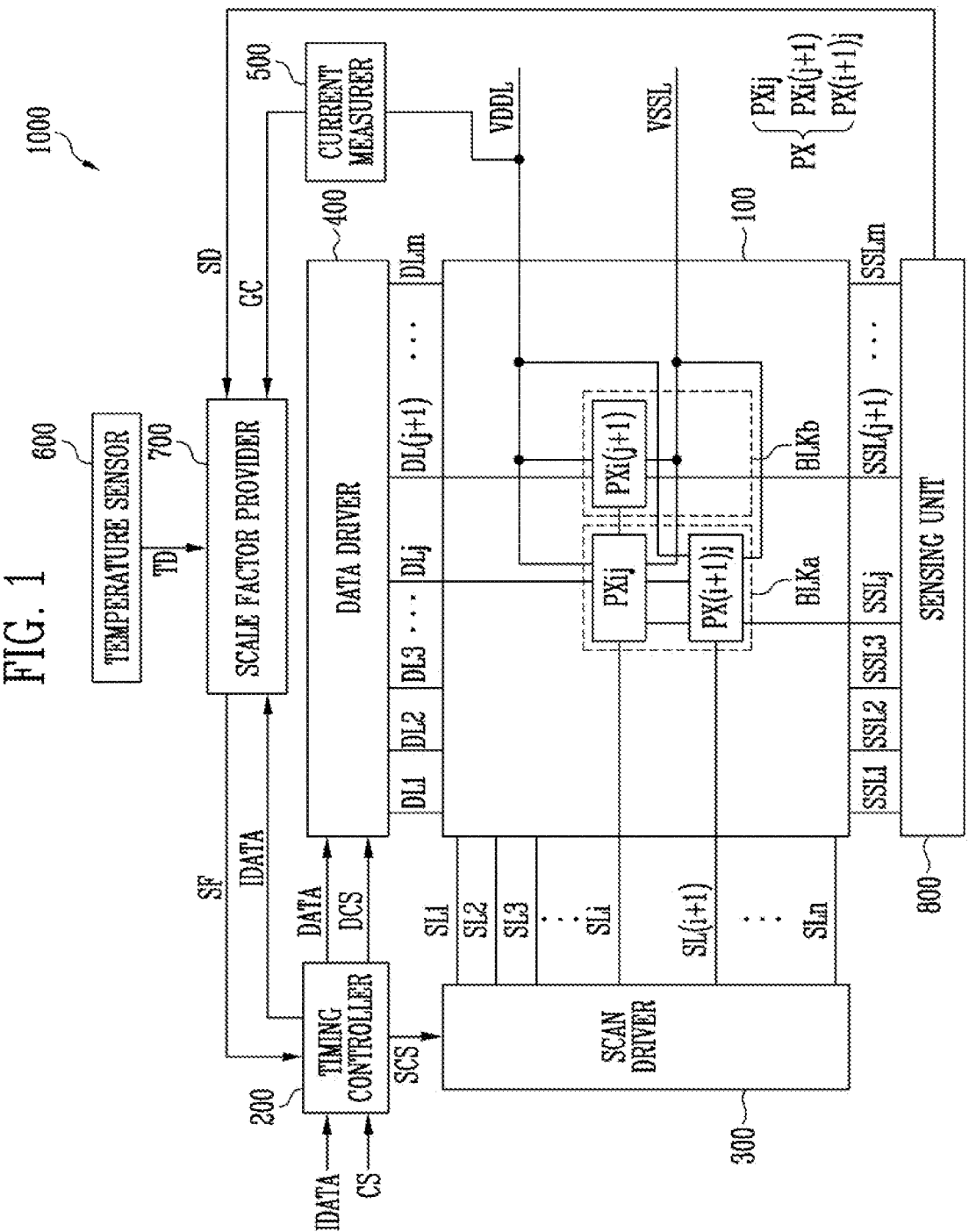
FIG. 1 is a diagram illustrating a display device according to an embodiment of the disclosure.

Hereinafter, various embodiments of the disclosure is described in detail with reference to the accompanying drawings so that those of ordinary skill in the art may implement the disclosure.

In order to clearly describe the disclosure, parts that are not related to the description are omitted, and the same or similar components are denoted by the same reference numerals throughout the specification. Therefore, the described reference numerals may be used in other drawings.

In addition, sizes and thicknesses of each component shown in the drawings may be shown for convenience of description, and thus the disclosure is not necessarily limited to those shown in the drawings. In the drawings, thicknesses may be exaggerated to clearly express various layers and areas.

In addition, an expression "is the same" in the description may mean "is substantially the same". That is, the expression "is the same" may be the same enough for those of ordinary skill in the art to understand that it is the same. Other expressions may also be expressions in which "substantially" is omitted.

FIG. 1 is a block diagram illustrating a display device according to an embodiment of the disclosure.

Referring to FIG. 1, the display device 1000 includes a display panel 100, a timing controller 200 (e.g., a control circuit), a scan driver 300 (e.g., a driver circuit), a data driver 400 (e.g., a data driver circuit), a current measurer 500 (e.g., a measuring circuit), a temperature sensor 600, and a scale factor provider 700 (e.g., a logic circuit), and a sensing unit 800 (e.g., a sensor circuit).

The display panel 100 include pixels PX. Each of the pixels PX may be connected to corresponding data line among a plurality of lines DL1 to DLm and a corresponding scan line among a plurality of scan lines SL1 to SLn. Here, a pixel PXij (where i and j are natural numbers) may mean a pixel in which a scan transistor is connected to an i-th scan line SLi and a j-th data line DLj, a pixel PXi(j+1) may mean a pixel in which the scan transistor is connected to the i-th scan line SLi and a (j+1)-th data line DL(j+1), and the pixel PX(i+1)j may mean a pixel in which the scan transistor is connected to an (i+1)-th scan line SL(i+1) and the j-th data line DLj.

The pixels PX may be connected to a first power line VDDL and a second power line VSSL. The pixels PX may receive a voltage of first power through the first power line VDDL and may receive a voltage of second power through the second power line VSSL. The voltage of the first power and the voltage of the second power may be voltages for driving the pixels PX, and a voltage level of the first power may be higher than a voltage level of the second power. For example, the voltage of the first power may be a positive voltage, and the voltage of the second power may be a negative voltage or a ground voltage.

The pixels PX may be commonly connected to the first power line VDDL. In addition, the pixels PX may be commonly connected to the second power line VSSL. However, a connection relationship between the pixels PX and the power line is not limited thereto. For example, the pixels PX may be connected to different second power lines. As another example, the pixels PX may also be connected to different first power lines.

The display panel 100 may be partitioned into a plurality of blocks BLKa and BLKb. Each of the blocks BLKa and BLKb may include at least one pixel. For example, the first block BLKa may include the pixels PXij and PX(i+1)j, and the second block BLKb may include the pixel PXi(j+1). In an exemplary embodiment, a given block BLKa includes two pixels and a given BLKb includes a single pixel.

The timing controller 200 may receive input image data IDATA and a control signal CS from an outside source. The control signal CS may include a synchronization signal, a clock signal, and the like. In addition, the input image data IDATA may include at least one image frame. For example, an image frame may include image data for all pixel rows of the display panel 100 to be output to the display panel 100 during a given frame period.

The timing controller 200 may generate a first control signal SCS (or a scan control signal) and a second control signal DCS (or a data control signal) based on the control signal CS. The timing controller 200 may supply the first control signal SCS to the scan driver 300 (e.g., a gate driver) and may supply the second control signal DCS to the data driver 400.

The first control signal SCS may include a scan start signal, a clock signal, and the like. The scan start signal may be a signal for controlling a timing of the scan signal. The clock signal included in the first control signal SCS may be used to shift the scan start signal.

The second control signal DCS may include a source start signal, a clock signal, and the like. The source start signal may control a sampling start time point of data. The clock signal included in the second control signal DCS may be used to control a sampling operation.

The timing controller 200 may provide the input image data IDATA to the scale factor provider 700, and scale grayscale values of the input image data IDATA using a scale factor SF received from the scale factor provider 700. The scale factor SF may be commonly applied to all pixels PX of the display panel 100. That is, the grayscale values of the input image data IDATA may be scaled at the same ratio based on the scale factor SF. For example, if first image data for a first pixel has a first greyscale value, second image data for a second pixel has a second greyscale value, the scale factor SF can be multiplied by both the greyscale values to generate scaled grayscale values.

The timing controller 200 may generate image data DATA by rearranging the input image data IDATA in which the grayscale values are scaled, and supply the image data DATA to the data driver 400.

The scan driver 300 may receive the first control signal SCS from the timing controller 200 and supply scan signals to scan lines SL1 to SLn (where n is a natural number) based on the first control signal SCS. For example, the scan driver 300 may sequentially supply the scan signals to the scan lines SL1 to SLn. When the scan signals are sequentially supplied, the pixels PX may be selected in a horizontal line unit (or a pixel row unit), and a data signal may be supplied to the selected pixels PX. To this end, the scan signal may be set to a gate on voltage (a low voltage or a high voltage) so that a transistor included in each of the pixels PX and receiving the scan signal is turned on. For example, a horizontal line unit may correspond to a row of the pixels. For example, a scan signal applied to a row of the pixels may be set to a gate on voltage when the row of the pixels is driven by the scan driver 300, and the scan signals of the other pixel rows may be set to a gate off voltage different from the gate on voltage.

The data driver 400 may receive the image data DATA and the second control signal DCS from the timing controller 200, and supply data signals (or data voltages) corresponding to the image data DATA to data lines DL1 to DLm (where m is a natural number) in response to the second control signal DCS. The data signals supplied to the data lines DL1 to DLm may be supplied to the pixels PX selected by the scan signals. To this end, the data driver 400 may supply the data signals to the data lines DL1 to DLm to be synchronized with the scan signal.

In this case, since the image data DATA is generated based on the input image data IDATA in which the grayscale values are scaled by the scale factor SF, the data driver 400 may supply the data signals corresponding to the scaled grayscale values to the data lines DL1 to DLm. For example, the data driver 400 may apply the data signal corresponding to the scaled grayscale value of the pixel PXij to the j-th data line DLj, and apply the data signal corresponding to the scaled grayscale value of the pixel PXi(j+1) to the (j+1)-th data line DL(j+1).

The current measurer 500 may be connected to the first power line VDDL commonly connected to the pixels PX. In an embodiment, the current measurer 500 is configured to sense an amount of current flowing through the first power line VDDL and provide a global current value GC to the scale factor provider 700. Here, the global current value GC may correspond to a current commonly supplied to all pixels PX through the first power line VDDL. However, the disclosure is not limited thereto, and for example, the current measurer 500 may be connected to the second power line VSSL commonly connected to the pixels PX, and sense a current flowing through the second power line VSSL. In an exemplary embodiment, the current measurer 500 is implemented using a current sensor such as a shunt resistor, a current transformer, a Rogowski coil, a magnetic-field based transducer, etc.

In an embodiment, the scale factor provider 700 calculates a frame load value corresponding to each image frame of the input image data IDATA, by using the received input image data IDATA. Here, the frame load value may correspond to the grayscale values of the image frame. For example, as a sum of the grayscale values of the image frame increases, a frame load value of the corresponding image frame may increase.

For example, in a full-white image frame, the frame load value may be 100, and in a full-black image frame, the frame load value may be 0. Here, the full-white image frame may mean an image frame in which all pixels PX of the display panel 100 are set to maximum grayscales (white grayscales) and emit light with a maximum luminance. In addition, the full-black image frame may mean an image frame in which all pixels PX of the display panel 100 are set to minimum grayscales (black grayscales) and not emit light. That is, the frame load value may have a value between 0 and 100. For example, the frame load value may be a percentage.

In an embodiment, the scale factor provider 700 calculates a load value for each block for each of the blocks BLKa and BLKb on the display panel 100. That is, the frame load value may include load values for each block corresponding to each of the blocks BLKa and BLKb. In other words, the frame load value may correspond to a sum of the load values for each block.

The display device 1000 may emit light of a block set as a reference block among the blocks BLKa and BLKb. In this case, the current measurer 500 may sense the current flowing through the first power line VDDL to generate the global current value GC, and supply the global current value GC to the scale factor provider 700. The scale factor provider 700 may store a unit target current value corresponding to the global current value GC in a memory.

Meanwhile, a storage operation of the unit target current value may be performed once when the display device 1000 is powered on. However, the disclosure is not limited thereto. For example, a time point and the number of times of the storage operation of the unit target current value may be variously set.

In an embodiment, the scale factor provider 700 generates a target current value based on the unit target current value and the frame load value, compares the global current value GC provided by the current measurer 500 with the target current value to generate a comparison value, and generates the scale factor SF based on the comparison value. For example, the scale factor provider 700 may determine a ratio between the target current value and the global current value GC as the scale factor SF. In an embodiment, the scale factor SF is determined by dividing the target current value by the global current value GC. For example, when the global current value GC is greater than the target current value, the scale factor provider 700 may determine the scale factor SF so that the grayscale values of the pixels PX are scaled to be less. As another example, when the global current value GC is less than the target current value, the scale factor provider 700 may determine the scale factor SF so that the grayscale values of the pixels PX are scaled to be greater. The above-described driving process may be referred to as global current management (GCM).

Meanwhile, current characteristics of driving transistors of the pixels PX may be different according to an ambient temperature of the display panel 100. For example, a current amount flowing through the driving transistor in response to the same voltage applied to a gate electrode may be different according to the ambient temperature. In addition, efficiencies of the pixels PX may be different according to the ambient temperature of the display panel 100. For example, efficiencies of light emitting elements included in the pixels PX may be different according to the ambient temperature. The efficiency may refer to a light emission luminance of the pixels PX compared to a current supplied to the pixels PX.

Accordingly, when the display device 1000 (or the scale factor provider 700) performs a GCM operation without considering the current characteristic of the driving transistor according to the ambient temperature of the display panel 100 and the efficiency of the pixels PX according to the ambient temperature of the display panel 100, an appropriate current may not be supplied to the pixels PX, and thus the pixels PX may emit light with a luminance different from a target luminance.

The display device 1000 (or the scale factor provider 700) according to an embodiment of the disclosure may predict the ambient temperature of the display panel 100, and determine the scale factor SF in consideration of the current characteristic of the driving transistor according to the ambient temperature and the efficiency of the pixels PX according to the ambient temperature.

According to an embodiment, the display device 1000 (or the scale factor provider 700) generates temperature data for each block through any one of the input image data IDATA and temperature data TD generated by the temperature sensor 600, or a combination thereof.

The temperature sensor 600 may sense the ambient temperature of the display panel 100 to the generate temperature data TD. The temperature sensor 600 may provide the temperature data TD to the scale factor provider 700.

The scale factor provider 700 may generate the temperature data for each block, and apply a weight to the frame load value based on the current characteristic of the driving transistor according to the temperature stored in a memory and the efficiency of the pixels PX according to the temperature, to calculate a correction frame load value.

In addition, the scale factor provider 700 may generate the target current value based on the correction frame load value and the unit target current value. For example, the scale factor provider 700 may generate the target current value by multiplying the correction frame load value and the unit target current value. The scale factor provider 700 may generate the scale factor SF based on the global current value GC and the target current value provided by the current measurer 500.

As described above, the display device 1000 (or the scale factor provider 700) according to an embodiment of the disclosure may perform the GCM operation in consideration of the current characteristic of the driving transistor according to the ambient temperature and the efficiency of the pixels PX according to the ambient temperature. Accordingly, an appropriate current may be supplied to the pixels PX in correspondence with the ambient temperature change.

The scale factor provider 700 may be located in an integrated chip (IC) separate from the timing controller 200. However, the disclosure is not limited thereto. For example, all or some of the scale factor provider 700 may be configured as an IC integrated with the timing controller 200. As another example, all or some of the scale factor provider 700 may be implemented in software in the timing controller 200.

In an embodiment, the sensing unit 800 generates sensing data SD including a characteristic value of the pixels PX based on sensing values provided from sensing lines SSL1 to SSLm. For example, the sensing unit 800 may detect a threshold voltage change of the driving transistor included in the pixel PX, a mobility change, a characteristic change of a light emitting element, and the like, and calculate a luminance maintenance rate of each of the blocks BLKa and BLKb from the threshold voltage change of the driving transistor, the mobility change, the characteristic change of the light emitting element, and the like. In this case, the luminance maintenance rate may be a size obtained by comparing a current luminance of the blocks BLKa and BLKb with a luminance before deterioration of the blocks BLKa and BLKb occurs. For example, the luminance before deterioration may correspond to a luminance of the blocks when the display device is first powered on.

FIG. 2 is a circuit diagram illustrating an example of the pixel included in the display device of FIG. 1.

Referring to FIG. 2, the pixel PXij includes transistors TR1, TR2, and TR3, a storage capacitor Cst, and a light emitting element LD.

Hereinafter, a circuit configured of an N-type transistor is described as an example. However, a circuit configured of a P-type transistor may be used instead by changing a polarity of a voltage applied to a gate terminal. As another example, a circuit configured of a combination of a P-type transistor and an N-type transistor may be used. The P-type transistor collectively refers to a transistor in which a conducted current amount increases when a voltage difference between a gate electrode and a source electrode increases in a negative direction. The N-type transistor collectively refers to a transistor in which a conducted current amount increases when a voltage difference between a gate electrode and a source electrode increases in a positive direction. The transistors may be configured in various forms, such as a thin film transistor (TFT), a field effect transistor (FET), and a bipolar junction transistor (BJT).

The first transistor TR1 may be connected between the first power line VDDL and the light emitting element LD (or a second node N2). A gate electrode of the first transistor TR1 may be connected to a first node N1. The first transistor TR1 may control a current amount flowing from the first power line VDDL to the second power line VSSL via the light emitting element LD in correspondence with a voltage of the first node N1. The first transistor TR1 may be referred to as a driving transistor.

The second transistor TR2 may be connected between the data line DLj and the first node N1. A gate electrode of the second transistor TR2 may be connected to the scan line SLi. The second transistor TR2 may be turned on when the scan signal is supplied to the scan line SLi, to electrically connect the data line DLj and the first node N1. Accordingly, a data signal may be transmitted to the first node N1. The second transistor TR2 may be referred to as a scan transistor.

The third transistor TR3 may be connected between the second node N2 and a sensing line SSLj. A gate electrode of the third transistor TR3 may be connected to a sensing control line SCLi. The third transistor TR3 may be turned on when a signal is supplied to the sensing control line SCLi, to electrically connect the second node N2 and the sensing line SSLj. Accordingly, a voltage or a current applied to a second electrode of the first transistor TR1 or a first electrode of the light emitting element LD may be sensed and transmitted to the sensing unit 800 (refer to FIG. 1). The third transistor TR3 may be referred to as a sensing transistor.

The storage capacitor Cst may be connected between the first node N1 corresponding to a gate electrode of the first transistor TR1 and the second electrode of the first transistor TR1. The storage capacitor Cst may store a voltage corresponding to a voltage difference between the gate electrode of the first transistor TR1 and the second electrode.

A first electrode (an anode electrode or a cathode electrode) of the light emitting element LD may be connected to the second electrode of the first transistor TR1, and a second electrode (a cathode electrode or an anode electrode) of the light emitting element LD may be connected to the second power line VSSL. The light emitting element LD may generate light of a predetermined luminance in correspondence with a current amount (driving current) supplied from the first transistor TR1.

The light emitting element LD may be implemented by an organic light emitting diode. In addition, the light emitting element LD may be implemented by an inorganic light emitting diode such as a micro light emitting diode (LED) or a quantum dot light emitting diode. In addition, the light emitting element LD may be implemented by an element configured of organic and inorganic materials in combination. In FIG. 2, the pixel PXij includes a single light emitting element LD, but in another embodiment, the pixel PXij may include a plurality of light emitting elements, and the plurality of light emitting elements may be connected to each other in series, in parallel, or in series-parallel.

The voltage of the first power may be applied to the first power line VDDL, and the voltage of the second power may be applied to the second power line VSSL. For example, the voltage of the first power may be greater than the voltage of the second power.

When a scan signal of a turn-on level (here, a logic high level) is applied through the scan line SLi, the second transistor TR2 is turned on. In this case, a voltage corresponding to the data signal applied to the data line DLj may be stored in the first node N1 (or the first electrode of the storage capacitor Cst).

A driving current corresponding to a voltage difference between the first electrode and the second electrode of the storage capacitor Cst may flow between the first electrode and the second electrode of the first transistor TR1. Accordingly, the light emitting element LD may emit light with a luminance corresponding to the data signal.

In an embodiment, the global current value GC provided by the current measurer 500 of FIG. 1 is a sum of driving current values flowing through all pixels PX of the display panel 100. In addition, since the grayscale values are scaled in correspondence with the scale factor SF generated by the scale factor provider 700 of FIG. 1 to adjust a size of the data signals, driving current values of the pixels PX may be adjusted.

Meanwhile, the pixel PXij of FIG. 2 is exemplary, and embodiments of the disclosure may be applied to pixels of another circuit. For example, the pixel PXij may further include a transistor that is turned on by further receiving an emission control signal to electrically connect the second electrode of the first transistor TR1 and the first electrode of the light emitting element LD to each other and/or the first electrode of the first transistor TR1 and the first power line VDDL to each other.

Figure 3B:
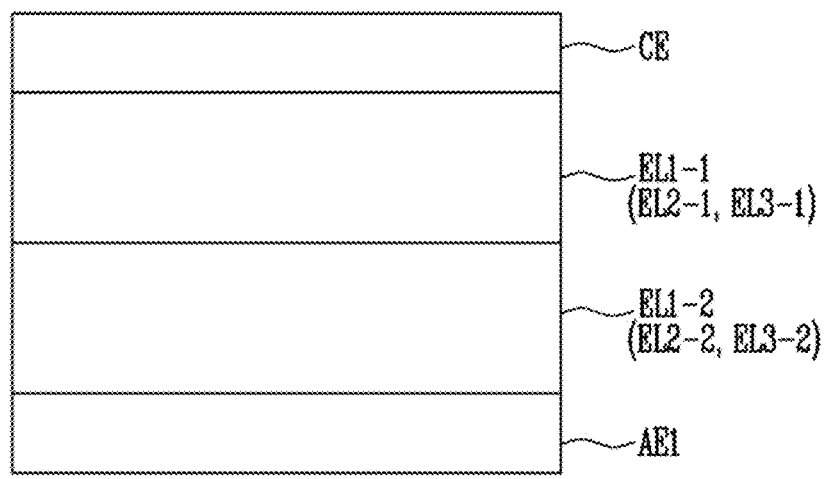
FIG. 3B is a diagram illustrating a tandem structure in which a light emitting element of FIG. 3A is modified.

FIG. 3A is a cross-sectional view of a pixel according to an embodiment. FIG. 3B is a diagram illustrating a tandem structure in which the light emitting element of FIG. 3A is modified.

Referring to FIG. 3A, according to an embodiment, a plurality of pixels PX may be arranged in a matrix form. Each of the plurality of pixels PX may include a first sub pixel SPX1 displaying a first color, a second sub pixel SPX2 displaying a second color, and a third sub pixel SPX3 displaying a third color. For example, the first sub pixel SPX1 may be a red pixel that emits red light having a peak wavelength in a range of about 610 nm to about 650 nm, the second sub pixel SPX2 may be green pixel that emits green light having a peak wavelength in a range of about 510 nm to about 550 nm, and the third sub pixel SPX3 may be a blue pixel that emits blue light having a peak wavelength in a range of about 430 nm to about 470 nm, but embodiments of the disclosure are not limited thereto.

The first sub pixel SPX1, the second sub pixel SPX2, and the third sub pixel SPX3 may be arranged in a stripe method where all pixels belonging to the same pixel column display the same color. For example, a plurality of first sub pixels SPX1 may be disposed in a pixel first column, a plurality of second sub pixels SPX2 may be disposed in a pixel second column, a plurality of third sub pixels SPX3 may be disposed in a pixel third column, and such an arrangement may be repeated along a row direction. However, the arrangement method of the pixels is not limited thereto, and various arrangement methods may be applied. For example, the first sub pixel SPX1, the second sub pixel SPX2, and the third sub pixel SPX3 may be arranged in a pentile method.

As shown in FIG. 3A, the display device 1000 may include a first substrate SUB1, a second substrate SUB2, and a filler FL interposed therebetween.

The first substrate SUB1 may include a first base substrate BSL1, transistors T1_1, T1_2, and T1_3, an insulating layer IL, a pixel defining layer PDL, light emitting elements LD1, LD2, and LD3, and a thin film encapsulation layer TFE.

The first base substrate BSL1 may be formed of a light transmitting material. The first base substrate BSL1 may be an organic substrate or a plastic substrate.

At least one or more transistors T1_1, T1_2, and T1_3 may be disposed on the first base substrate BSL for each of the sub pixels SPX1, SPX2, and SPX3.

The insulating layer IL may be disposed on the transistors T1_1, T1_2, and T1_3. The insulating layer IL may be formed of an organic layer. For example, the insulating layer IL may include an acrylic resin, an epoxy resin, an imide resin, an ester resin, and the like.

Pixel electrodes AE1, AE2, and AE3 may be disposed on the insulating layer IL for each of the sub pixels SPX1, SPX2, and SPX3. The pixel electrodes AE1, AE2, and AE3 may be connected to the transistors T1_1, T1_2, and T1_3 through a via hole passing through the insulating layer IL, respectively. In an embodiment, the pixel electrodes AE1, AE2, and AE3 may be anode electrodes of the light emitting element.

The pixel defining layer PDL may be positioned on the pixel electrodes AE1, AE2, and AE3. The pixel defining layer PDL may include an opening partially exposing the pixel electrodes AE1, AE2, and AE3. Among the pixel electrodes AE1, AE2, and AE3, areas exposed without being covered by the pixel defining layer PDL may be emission areas PA1, PA2, and PA3, and an area covered by the pixel defining layer PDL may be a non-emission area PB. The pixel defining layer PDL may include an organic insulating material.

Organic emission layers EL1, EL2, and EL3 may be disposed on the pixel electrodes AE1, AE2, and AE3 exposed by the opening of the pixel defining layer PDL. In FIG. 3A, the organic emission layers EL1, EL2, and EL3 are formed to be separated for each of the pixels SPX1, SPX2, and SPX3, but the organic emission layers EL1, EL2, and EL3 may be integrally connected without division of the pixel.

A common electrode CE may be disposed on the organic emission layers EL1, EL2, and EL3.

The first pixel electrode AE1, the first organic emission layer EL1, and the common electrode CE may form the first light emitting element LD1. The second pixel electrode AE2, the second organic emission layer EL2, and the common electrode CE may form the second light emitting element LD2. The third pixel electrode AE3, the third organic emission layer EL3, and the common electrode CE may form the third light emitting element LD3.

Third color light L3 emitted from each of the light emitting elements LD1, LD2, and LD3 disposed in the respective sub pixels SPX1, SPX2, and SPX3 may be provided to the corresponding sub pixels SPX1, SPX2, and SPX3.

The thin film encapsulation layer TFE may be disposed on the common electrode CE. The thin film encapsulation layer TFE may be disposed on the light emitting elements LD1, LD2, LD3 to prevent permeation of an impurity, moisture, or the like from the outside and may be disposed to seal the light emitting elements LD1, LD2, and LD3. The thin film encapsulation layer TFE may include a first encapsulation inorganic layer IOL1 including an inorganic material, a second encapsulation inorganic layer IOL2, and an encapsulation organic layer OL disposed between the first encapsulation inorganic layer IOL1 and the second encapsulation inorganic layer IOL2.

Hereinafter, a second substrate SUB2 is described. The second substrate SUB2 may include a second base substrate BSL2, a light blocking pattern BM, color filters CF1, CF2, and CF3, wavelength conversion patterns LT1 and LT2, a plurality of stacked capping layers CP1 and CP2, and a light transmission pattern TP.

The second base substrate BSL2 faces the first base substrate BSL1. The second base substrate BSL2 may include at least one material selected from the exemplified materials of the first base substrate BSL1.

The light blocking pattern BM may be disposed on one surface of the second base substrate BSL2 facing the first substrate SUB1. The light blocking pattern BM may block transmission of light. Specifically, the light blocking pattern BM may prevent color mixture of light emitted to a display surface in each of the sub pixels SPX1, SPX2, and SPX3. The light blocking pattern BM may include at least one of an opaque organic material, a metal material including chromium, carbon black, or the like. In this case, the light blocking pattern BM may be disposed to overlap the pixel defining layer PDL in a thickness direction.

A color filter CF may be disposed on one surface of the second base substrate BSL2. The color filter CF may also be disposed on the light blocking pattern BM. The color filter CF may be an absorption filter that absorbs light of a specific wavelength and transmits light of another specific wavelength.

The first color filter CF1 may block or absorb the third color light L3 of the third color light L3 and first color light L1 emitted from the first wavelength conversion pattern LT1. That is, the first color filter CF1 may function as a third color light L3 blocking filter that blocks the third color light L3, and may function as a filter that selectively transmits the first color light L1. The first color filter CF1 may include a red colorant. In this case, the third color light may be the light emitted from the organic emission layers EL1, EL2, and EL3, and may be, for example, blue light. The first color light L1 may be red light.

The second color filter CF2 may block or absorb the third color light L3 of the third color light L3 and second color light L2 emitted from the second wavelength conversion pattern LT2. That is, the second color filter CF2 may function as a third color light L3 blocking filter that blocks the third color light L3, and may function as a filter that selectively transmits the second color light L2. The second color filter CF2 may include a green colorant. In this case, the third color light may be the light emitted from the organic emission layers EL1, EL2, and EL3, and may be blue light. The second color light L2 may be green light.

The third color filter CF3 may transmit the third color light L3 emitted from the light transmission pattern TP. The third color filter CF3 may function as a blue light transmission filter. The third color filter CF3 may include a blue colorant. In this case, the third color light may be the light emitted from the organic emission layers EL1, EL2, and EL3, and may be, for example, blue light.

A first capping layer CP1 may be disposed on each of the color filters CF1, CF2, and CF3. The first capping layer CP1 may be disposed over the entire surface of the color filters CF1, CF2, and CF3.

The first capping layer CP1 may prevent an impurity such as moisture or air from permeating from the outside to damage or contaminate each of the color filters CF1, CF2, and CF3.

The first capping layer CP1 may be formed of an inorganic material. For example, the first capping layer CP1 may include silicon nitride, aluminum nitride, zirconium nitride, titanium nitride, hafnium nitride, tantalum nitride, silicon oxide, aluminum oxide, titanium oxide, tin oxide, cerium oxide, silicon oxynitride, or the like.

The wavelength conversion pattern LT and the light transmission pattern TP may be disposed on the first capping layer CP1. The wavelength conversion pattern LT may include the first wavelength conversion pattern LT1 and the second wavelength conversion pattern LT2.

The first wavelength conversion pattern LT1 may convert the third color light L3 into the first color light L1 and emit the first color light L1. The second wavelength conversion pattern LT2 may convert the third color light L3 into the second color light L2 and emit the second color light L2. The light transmission pattern TP may transmit the third color light L3 as it is.

The first wavelength conversion pattern LT1 may include a first base resin LT11 and a first wavelength conversion particle LT12 dispersed in the first base resin LT11. The second wavelength conversion pattern LT2 may include a second base resin LT21 and a second wavelength conversion particle LT22 dispersed in the second base resin LT21. Although not shown, each of the wavelength conversion patterns LT1 and LT2 may further include a scattering particle dispersed in each of the base resins LT11 and LT21.

In an embodiment, each of the base resins LT11 and LT21 has a high light transmittance and has a material having an excellent dispersion characteristic for each of the wavelength conversion particles LT12 and LT22 and the scattering particle. For example, each of the base resins LT11 and LT21 may include an organic material such as an epoxy resin, an acrylic resin, a cardo resin, or an imide resin.

The first wavelength conversion particle LT12 may convert the third color light L3 into the first color light L1, and the second wavelength conversion particle LT22 may convert the third color light L3 into the second color light L2. An example of each of the wavelength conversion particles LT12 and LT22 may include a quantum dot, a quantum rod, phosphors, and the like. For example, the quantum dot may be a particle material that emits a specific color as an electron transits from a conduction band to a valence band. When both of the first wavelength conversion particle LT12 and the second wavelength conversion particle LT22 are formed of the quantum dots, a diameter of the quantum dot forming the first wavelength conversion particle LT12 may be greater than that of the quantum dot forming the second wavelength conversion particle LT22.

The quantum dot may be a semiconductor nano crystalline material. The quantum dot may have a specific band gap according to composition and size thereof, absorb light, and then emit light having a unique wavelength. An example of the semiconductor nano crystal of the quantum dot may include IV group nano crystal, II-VI group compound nano crystal, III-V group compound nano crystal, IV-VI group nano crystal, or a combination thereof. The quantum dot may have a core-shell structure including a core including the above-described nano crystal and a shell surrounding the core.

The light transmission pattern TP may include a third base resin TP11 and a scattering particle ST. In an embodiment, the scattering particle ST is a material capable of scattering at least some of the transmitted light, but may be, for example, a metal oxide particle or an organic particle. An example of the metal oxide may include titanium oxide ($TiO_2$), zirconium oxide ($ZrO_2$), aluminum oxide ($Al_2O_3$), indium oxide ($In_2O_3$), zinc oxide ($ZnO$), or tin oxide ($SnO_2$). An example of a material of the organic particle may include acrylic resin, urethane resin, and the like. The scattering particle ST may scatter light in a random direction regardless of an incident direction of incident light without substantially converting a wavelength of light that penetrates the light transmission pattern TP.

In an embodiment, the third base resin TP11 is a material having high light transmittance and is a material having an excellent dispersion characteristic for each scattering particle ST. For example, the third base resin TP11 may include an organic material such as an epoxy resin, an acrylic resin, a cardo resin, or an imide resin.

A second capping layer CP2 may be disposed on the wavelength conversion pattern LT and the light transmission pattern TP. The second capping layer CP2 may cover the wavelength conversion pattern LT and the light transmission pattern TP. The second capping layer CP2 may include an inorganic material. The second capping layer CP2 may be formed of the same material as the first capping layer CP1, or may be selected from materials exemplified in the description of the first capping layer CP1.

Referring to FIGS. 3A and 3B, the organic emission layers EL1, EL2, and EL3 according to an embodiment of the disclosure may have a tandem structure. For example, the first organic emission layer EL1 may include two layers EL1-1 and EL1-2 that emit light of the same color or different colors. Both of the two layers EL1-1 and EL1-2 emitting the same color may be blue emission layers. One of the two layers EL1-1 and EL1-2 emitting different colors may be a blue emission layer, and the other may be a green emission layer. In this case, the third color light L3 may be light in which blue and green are combined.

However, the tandem structure is not limited thereto, and the organic emission layers EL1, EL2, and EL3 may include three or more layers that emit light of the same color or different colors. In this case, a combination of colors emitted by each of the layer may be variously modified. For example, the color emitted by each layer may be any one of red, green, blue, white, yellow, magenta, and cyan colors.

According to an embodiment, when the organic emission layers EL1, EL2, and EL3 are configured of three layers, the three layers may emit red, green, and blue, or may emit blue, green, and blue, respectively. In this case, the third color light L3 may be light in which red, green, and blue are combined, or light in which blue and green are combined. According to another embodiment, when the organic emission layers EL1, EL2, and EL3 are configured of four layers, the four layers may emit red, green, blue, and white, respectively, or two layers may emit blue and the other two layers may emit green color. In this case, the third color light L3 may be light in which red, green, blue, and white are combined, or light in which blue and green are combined.

Although the first organic emission layer EL1 is described as an example, the second organic emission layer EL2 may include two layers EL2-1 and EL2-2, the third organic emission layer EL3 may include two layers EL3-1 and EL3-2, and the second organic emission layer EL2 and the third organic emission layer EL3 may be configured substantially the same as the first organic emission layer EL1.

Although not shown, a charge generation layer may be positioned between the two layers EL1-1 and EL1-2. The charge generation layer may be formed between adjacent emission layers and serve to adjust a charge balance between the adjacent emission layers.

Figure 4:
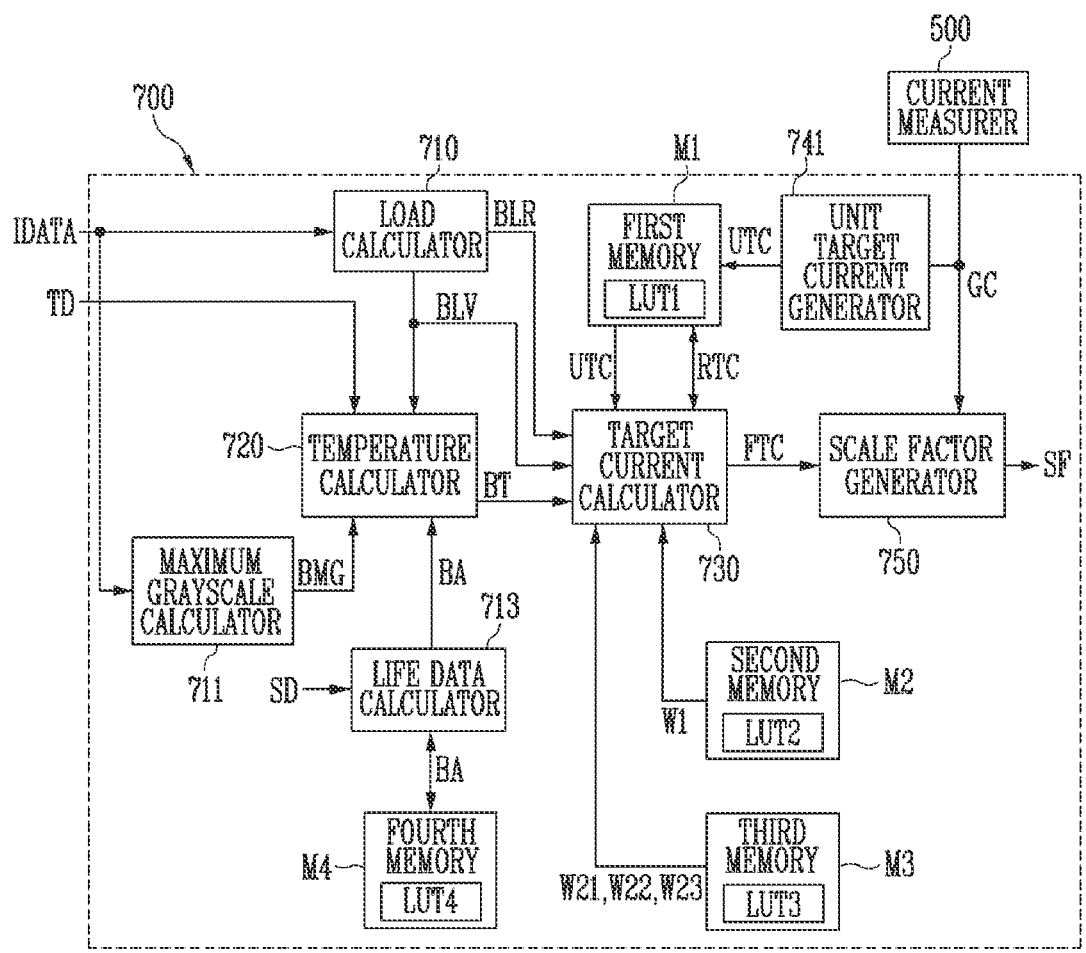
FIG. 4 is a block diagram illustrating a configuration of a scale factor provider shown in FIG. 1.
Figures 5A, 5B:
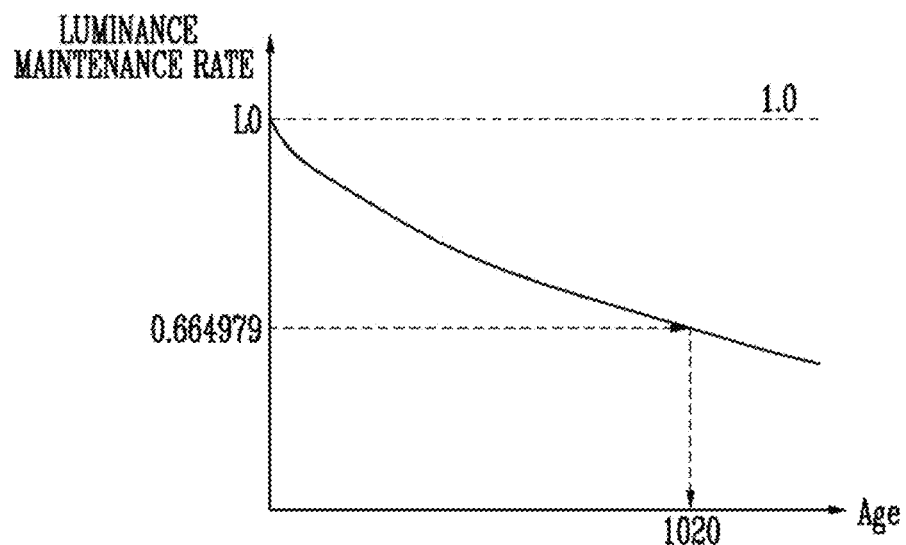
FIG. 5A is an exemplary graph corresponding to a life-luminance function of a block (or pixel)
FIG. 5B is an embodiment of a lookup table created based on the life-luminance function of FIG. 5A.
Figures 6, 7:
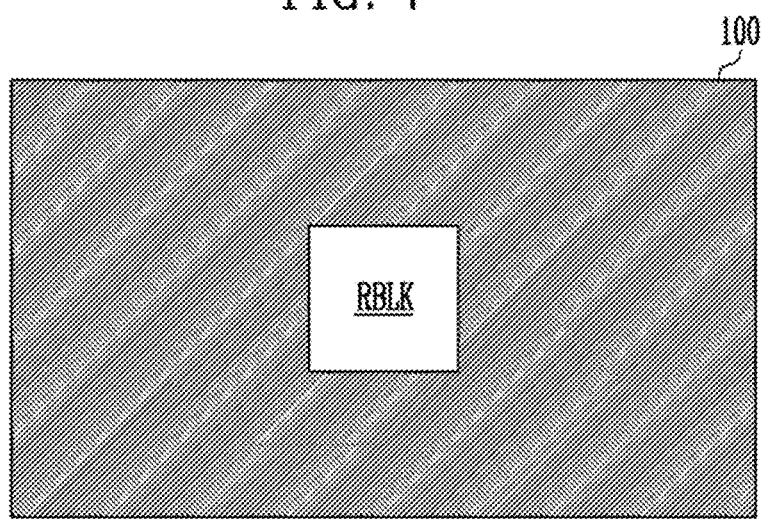
FIG. 6 is a diagram illustrating blocks included in a display panel of FIG. 1.
FIG. 7 is a diagram illustrating a reference block set on the display panel of FIG. 6.
Figure 8:
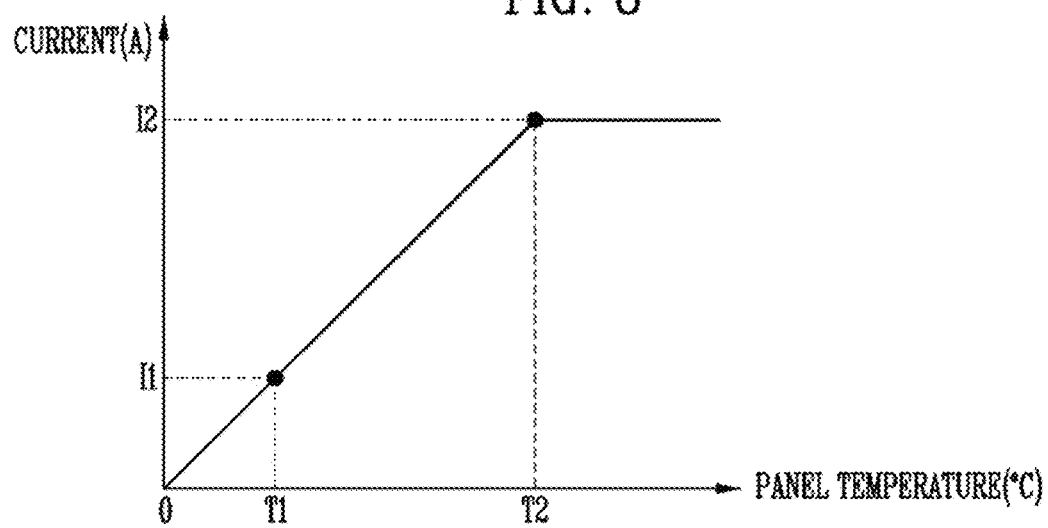
FIG. 8 is a graph illustrating a current characteristic of pixels for each temperature of the display panel.
Figure 9A:
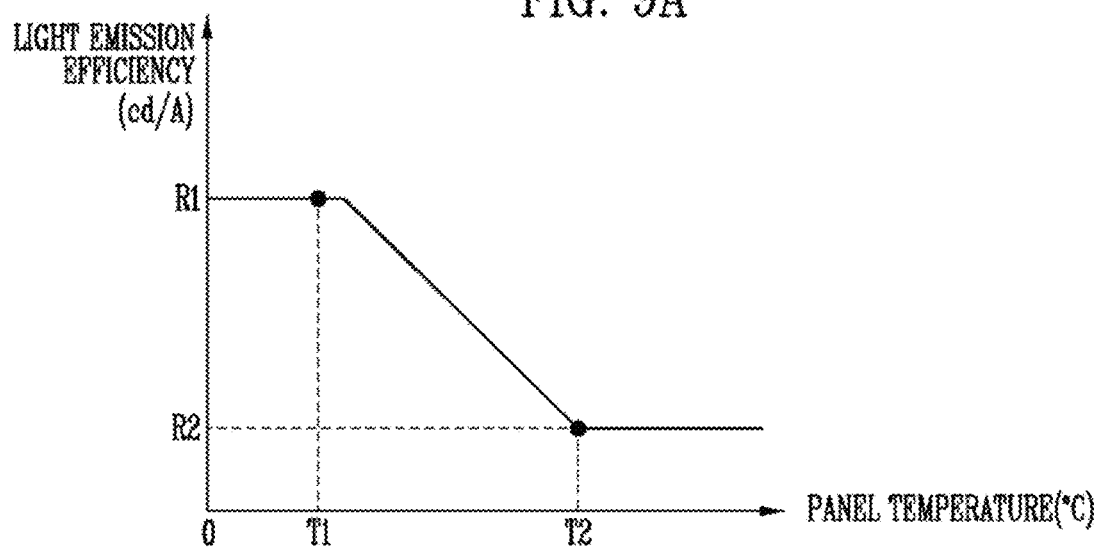
FIGS. 9A to 9C are graphs illustrating an efficiency characteristic of each of sub pixels according to a temperature of the display panel.
Figure 9B:
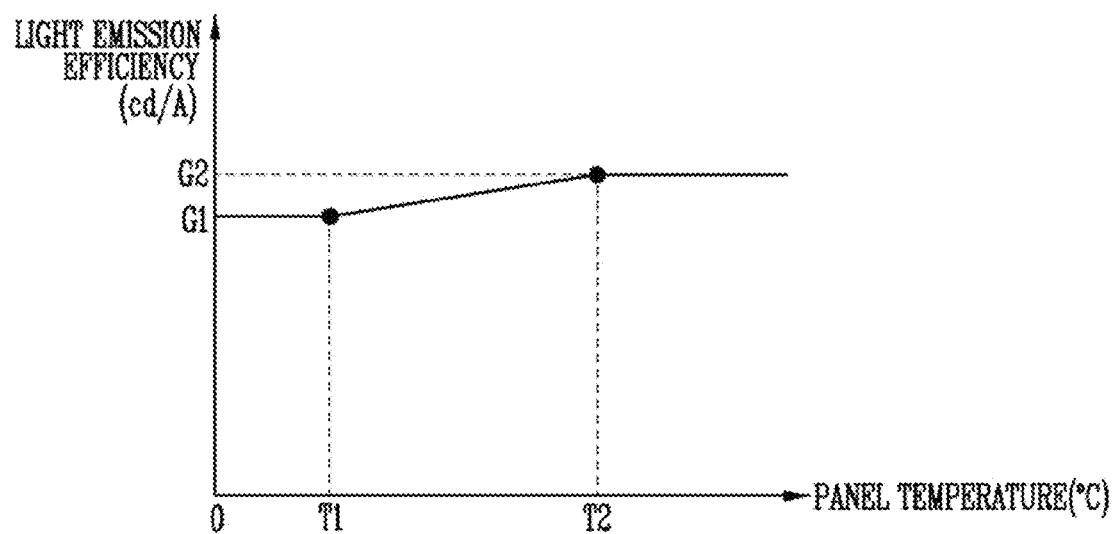
Figure 9C:
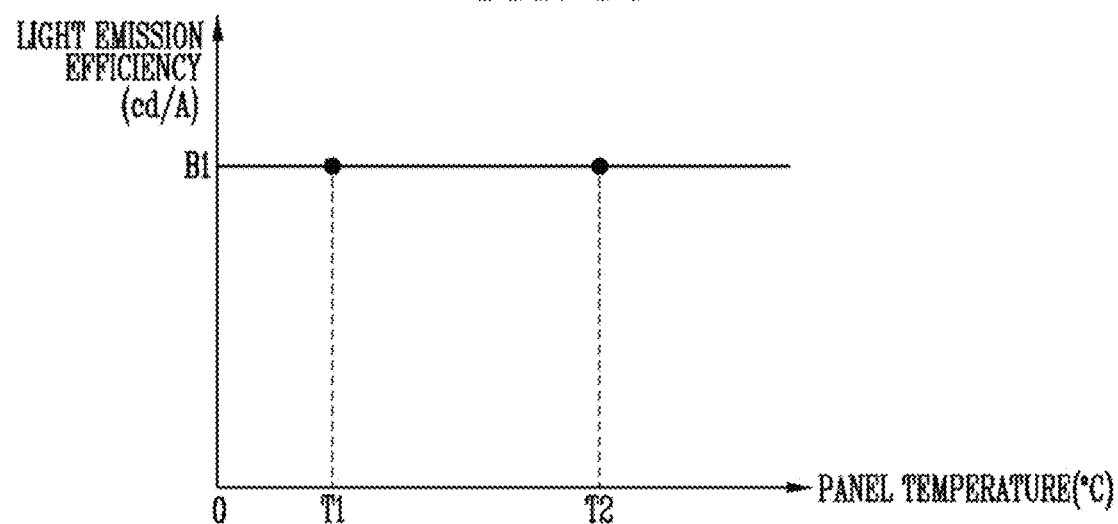
Figure 10:
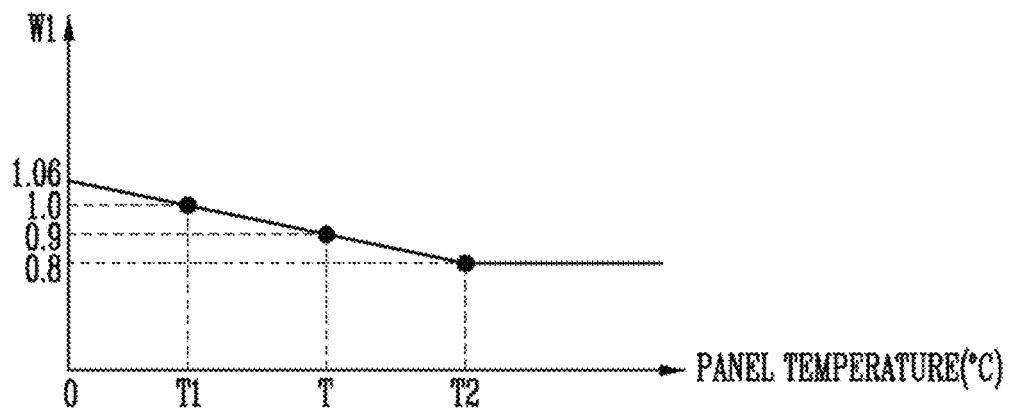
FIG. 10 is a graph illustrating a first weight according to the current characteristic of the pixels.
Figure 11A:
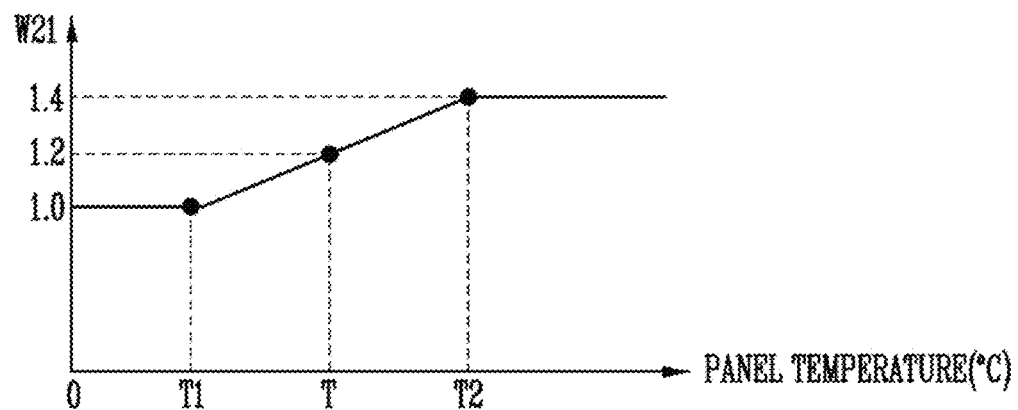
FIGS. 11A to 11C are graphs illustrating a second weight according to the efficiency characteristic of each of the sub pixels for each temperature of the display panel.
Figure 11B:
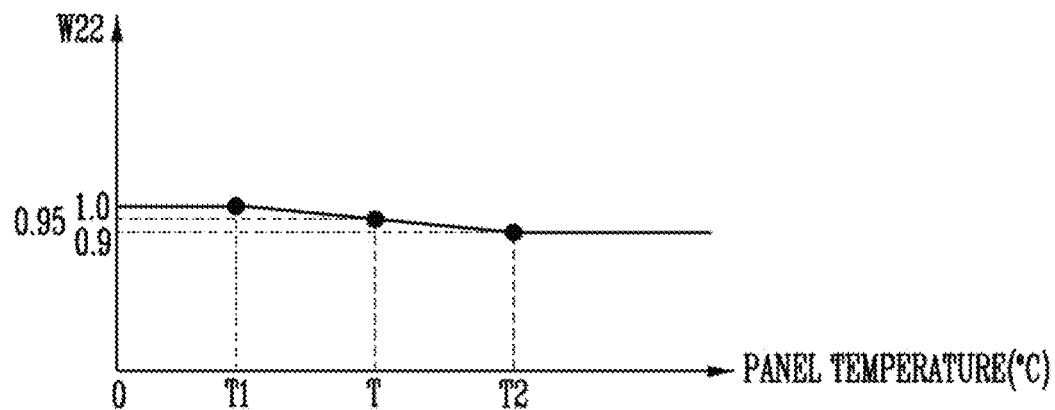
Figure 11C:
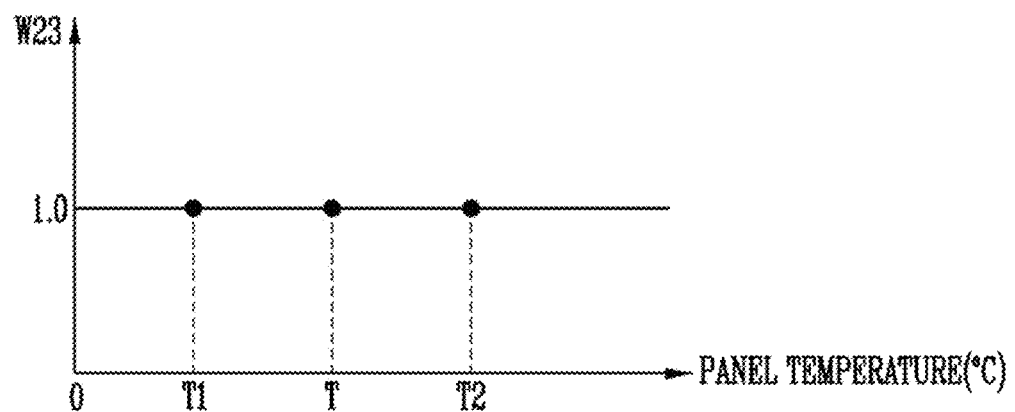

FIG. 4 is a block diagram illustrating a configuration of the scale factor provider shown in FIG. 1, FIG. 5A is an exemplary graph corresponding to a life-luminance function of a block (or pixel), FIG. 5B is an embodiment of a lookup table created based on the life-luminance function of FIG. 5A, FIG. 6 is a diagram illustrating blocks included in the display panel of FIG. 1, FIG. 7 is a diagram illustrating a reference block set on the display panel of FIG. 6, FIG. 8 is a graph illustrating a current characteristic of pixels for each temperature of the display panel, FIGS. 9A to 9C are graphs illustrating an efficiency characteristic of each of sub pixels according to the temperature of the display panel, FIG. 10 is a graph illustrating a first weight according to the current characteristic of the pixels, and FIGS. 11A to 11C are graphs illustrating a second weight according to the efficiency characteristic of each of the sub pixels for each temperature of the display panel.

Referring to FIG. 4, the scale factor provider 700 according to an embodiment of the disclosure generates the scale factor SF in consideration of the current characteristic of the pixels PX according to the ambient temperature and the efficiency characteristic of the pixels PX according to the ambient temperature. Hereinafter, an operation of the scale factor provider 700 is specifically described.

According to an embodiment of the present application, the scale factor provider 700 includes a load calculator 710, a maximum grayscale calculator 711, a life data calculator 713, a temperature calculator 720, a target current calculator 730, a current measurer 740, a unit target current generator 741, a scale factor generator 750, and first to fourth memories M1 to M4. In this case, for convenience of description, the first to fourth memories M1 to M4 are shown as separate and independent configurations, but the first to fourth memories M1 to M4 may be one integrated configuration.

The load calculator 710 may receive the input image data IDATA from the timing controller 200 and calculate a load value BLV for each block, by using the received input image data IDATA. The load calculator 710 may receive the grayscale values for an image frame and provide the load values BLV for the blocks BLK11 to BLK35 (refer to FIG. 6) based on the grayscale values. For example, the load calculator 710 may calculate the load value for each of the blocks BLK11 to BLK35 by summing the grayscale values corresponding to the pixels PX included in each of the blocks BLK11 to BLK35.

In addition, the load calculator 710 may calculate a load value ratio BLR for each block, which is defined as a ratio between a load value of the first sub pixel SPX1 (refer to FIG. 3A), a load value of the second sub pixel SPX2, and load values of the third sub pixel SPX3 for each block, using the input image data IDATA. According to an embodiment, the load calculator 710 may apply different weights to grayscale values of different colors. For example, the load calculator 710 may multiply red grayscale values included in each of the blocks BLK11 to BLK35 by a weight of 1.2, multiply green grayscale values by a weight of 0.8, multiply blue grayscale values by a weight of 1.0, and then may sum values obtained by the multiplication, to calculate the load value BLV for each block. However, the disclosure is not limited thereto. For example, the load calculator 710 may apply the same weight to grayscale values of different colors.

The temperature calculator 720 may generate temperature data BT for each of the blocks BLK11 to BLK35 based on the load value BLV for each block. The ambient temperature of the display panel 100 may change in correspondence with the load value BLV for each block. For example, since the current amount flowing through the display panel 100 is proportional to the load value BLV for each block, a temperature of a block having the load value BLV for each block may be higher than a temperature of a block having the load value BLV for each block.

According to an embodiment, the scale factor provider 700 may further include at least one of a maximum gray scale calculator 711 that generates a maximum grayscale value BMG for each block based on the input image data IDATA, and a life data calculator 713 that calculates a life (e.g., a life value) of the display panel 100 and provides life data BA for each block based on the life value.

The maximum grayscale calculator 711 may receive the input image data IDATA from the timing controller 200 and calculate the maximum grayscale value BMG for each block, by using the received input image data IDATA. The maximum grayscale calculator 711 may receive the grayscale values for the image frame and provide the maximum grayscale value BMG for each block for the blocks BLK11 to BLK35 based on the grayscale values. For example, the maximum grayscale calculator 711 may select a grayscale having a maximum size among grayscale values corresponding to each of the first sub pixel SPX1, the second sub pixel SPX2, and the third sub pixel SPX3 included in each of the blocks BLK11 to BLK35, and calculate the grayscale values as the maximum grayscale value BMG for each block.

The ambient temperature of the display panel 100 may change in correspondence with the maximum grayscale value BMG for each block. For example, since the current amount flowing through the display panel 100 is proportional to the maximum grayscale value BMG for each block, a temperature of the block having the maximum grayscale value BMG for each large block may be higher than a temperature of the block having the maximum grayscale value BMG for each small block.

The life data calculator 713 may calculate life data BA for each block based on the sensing data SD received from the sensing unit 800 shown in FIG. 1.

FIGS. 5A and 5B are referred to for describing the life data BA for each block. Referring to the life-luminance function shown in FIG. 5A, the blocks BLK11 to BLK35 (or the pixel PX) may emit light with a first luminance L0 initially (that is, AGE=0). However, as deterioration occurs, the luminance emitted by the blocks BLK11 to BLK35 may gradually decrease. In this case, a horizontal axis indicates a degree of the deterioration, and a vertical axis indicates a luminance maintenance rate of the blocks BLK11 to BLK35 corresponding to a corresponding deterioration time point. The luminance maintenance rate is a size obtained by comparing a current luminance of the blocks BLK11 to BLK35 (or the luminance after the deterioration of the blocks occurs) with the first luminance L0 of the blocks BLK11 to BLK35 (or the luminance before the deterioration of the blocks occurs).

A fourth lookup table LUT4 shown in FIG. 5B may include information on the luminance maintenance rate according to a deterioration value AGE of the blocks BLK11 to BLK35 based on the life-luminance function of FIG. 5A. The fourth lookup table LUT4 expresses the deterioration value AGE from 0 to 1024 in 4 size intervals. That is, the deterioration value AGE may include 0, 4, 8, 12, 16, ..., 1020, and 1024. The life data calculator 713 may calculate a new deterioration value AGE that is not stored in the fourth lookup table LUT4 through a linear interpolation operation. Meanwhile, the fourth lookup table LUT4 may be stored in a fourth memory M4 shown in FIG. 4.

The life data calculator 713 may inversely infer the deterioration value AGE (or the life data BA for each block) corresponding to the luminance maintenance rate of the block BLK, by using the fourth lookup table LUT4. According to an embodiment, the life data calculator 713 may receive the sensing data SD from the sensing unit 800 shown in FIG. 1. The sensing data SD may include a current luminance maintenance rate of each of the blocks BLK11 to BLK35. The life data calculator 713 may calculate the deterioration value AGE of each of the blocks BLK11 to BLK35 (or the life data BA for each block) from the current luminance maintenance rate of each of the blocks BLK11 to BLK35, by using the fourth lookup table LUT4. For example, as shown in FIG. 5B, when the luminance maintenance rate of a specific block among the blocks BLK11 to BLK35 included in the sensing data SD is 0.664979, the life data calculator 713 may calculate the deterioration value AGE (or the life data BA for each block) of the specific block as 1020.

The ambient temperature of the display panel 100 may change in correspondence with the life data BA for each block. For example, the current amount flowing through the display panel 100 may decrease as the deterioration value AGE of the pixels PX included in the display panel 100 increases. That is, a temperature of a block having a high deterioration value AGE (or life data BA for each block) may be lower than a temperature of a block having a low deterioration value AGE (or life data BA for each block).

The temperature calculator 720 may generate the temperature data BT for each block, based on at least one of the load value BLV for each block provided from the load calculator 710, and the maximum grayscale value BMG for each block, the temperature data TD, and the life data BA, which may be obtained in correspondence with whether the maximum grayscale calculator 711, the temperature sensor 600, and the life data calculator 713 are included.

The target current calculator 730 may generate a final target current value FTC (or a second target current value) based on a reference target current value RTC (or a first target current value) corresponding to a preset first temperature, first weight data W1 according to the current characteristic of the pixels for each temperature of the display panel 100, and second weight data according to the efficiency characteristic of the pixels for each temperature of the display panel. In this case, the preset first temperature may be a room temperature, and may be 20±5° C.

As described with reference to FIG. 1, the unit target current generator 741 may calculate a unit target current value UTC and set at least one of the blocks BLK11 to BLK35 as a reference block in order to perform a storage operation in a first memory M1. To describe the reference block, referring to FIG. 6, the pixels PX of the display panel 100 may be partitioned into a plurality of blocks BLK11, BLK12, BLK13, BLK14, BLK15, BLK21, BLK22, BLK23, BLK24, BLK25, BLK31, BLK32, BLK33, BLK34, and BLK35. Each of the blocks BLK11 to BLK35 may include at least one pixel PX. The number of blocks BLK11 to BLK35 may be equal to or less than the number of pixels PX.

In an embodiment, the display panel 100 may be partitioned into blocks BLK11 to BLK35 of the same size, and thus each of the blocks BLK11 to BLK35 may include the same number of pixels PX. However, this is an example, and the disclosure is not limited thereto. For example, all or some of the blocks BLK11 to BLK35 may share one or more pixels PX, and some of the blocks BLK11 to BLK35 may include pixels PX more than those of other blocks BLK11 to BLK35.

Meanwhile, in FIG. 6, the display panel 100 is partitioned into 15 blocks BLK11 to BLK35, but this is an example, and the disclosure is not limited thereto. For example, the display panel 100 may be partitioned into 100 blocks.

Referring to FIG. 4 again, when the display device 1000 shown in FIG. 1 is powered on, the display device 1000 may emit light of the reference block among the blocks BLK11 to BLK35. Here, as shown in FIG. 7, the reference block RBLK may correspond to the block BLK23 positioned at a center of the display panel 100. However, this is an example, and the reference block RBLK may be variously set. For example, the reference block may be set in correspondence with a block positioned outside the display panel 100. As another example, a plurality of blocks among the blocks BLK1 to BLK35 may be set as the reference block.

The display device 1000 may cause the pixels included in the reference block RBLK to emit light with a highest grayscale (for example, a white grayscale), and cause the remaining blocks not to emit light (for example, a black grayscale). In this case, the current measurer 740 may sense the current flowing through the first power line VDDL to generate the global current value GC, and provide the global current value GC to the unit target current generator 741 (e.g., a calculator). The unit target current generator 741 may generate or calculate a unit target current value UTC in correspondence with the global current value GC. For example, the unit target current generator 741 may store the global current value GC as the unit target current value UTC in the first memory M1.

As shown in FIGS. 6 and 7, when one (for example, the block BLK23) of the 15 blocks BLK11 to BLK35 is set as the reference block RBLK, the display device 1000 causes the pixels included in the reference block RBLK to emit light with the highest grayscale and causes the remaining blocks not to emit light, the global current value GC may correspond to the unit target current value UTC corresponding to about 6.67%, which is 1/15 based on a full-white image frame. Alternatively, as in the above-described example, assuming that the display panel 100 is partitioned into 100 blocks, the global current value GC may correspond to the unit target current value UTC corresponding to 1% based on the full-white image frame.

In an embodiment of the disclosure, the unit target current value UTC is generated once when the display device 1000 is powered on and stored in the first memory M1 of the scale factor provider 700. Thereafter, the unit target current value UTC may be used during a display period (e.g., a frame period) of the image frames of the display device 1000.

According to an embodiment, the target current calculator 730 may calculate the reference target current value RTC (or the first target current value) at the first temperature (that is, the room temperature), by using the load value BLV for each block, the load value ratio BLR for each block, and the unit target current value UTC. For example, the target current calculator 730 may calculate the frame load value by summing the load value BLV for each block to which the load value ratio BLR for each block is applied, and may calculate the reference target current value RTC (or the first target current value) by multiplying the frame load value by the unit target current value UTC. The target current calculator 730 may store the reference target current value RTC (or the first target current value) corresponding to the frame load value as a first lookup table LUT1 in the first memory M1 or in the first lookup table LUT1.

The target current calculator 730 may generate the final target current value FTC (or the second target current value) by considering the first weight data W1 (refer to FIG. 10) according to the current characteristic of the pixels for each temperature of the display panel 100, and the second weight data W21, W22, and W23 (refer to FIGS. 11A to 11C) according to the efficiency characteristic of the pixels for each temperature of the display panel 100 on the reference target current value RTC (or the first target current value).

FIG. 8 is referred to for describing the current characteristic of the pixels PX. Referring to FIG. 8, as the temperature of the display panel 100 increases within a predetermined temperature range, the current amount flowing through the first transistor TR1 (refer to FIG. 2) included in the display pixel PX may increase to a predetermined size. In other words, when the temperature of the display panel 100 increases within the predetermined temperature range, since the current amount flowing through the first transistor TR1 increases, the luminance of the display panel 100 may increase.

For example, the current amount of the display panel 100 (or the current amount flowing through the first transistor TR1) may have a first current amount I1 at the first temperature T1 (for example, the room temperature), and may have a second current amount I2 greater than the first current amount I1 at a second temperature T2 (or a preset saturation temperature) (for example, 100° C.). That is, the current amount of the display panel 100 (or the current amount flowing through the first transistor TR1) may linearly increase from the first temperature T1 (for example, the room temperature) to the second temperature T2 (for example, 100° C.) in proportion to the temperature of the display panel 100.

The current amount of the display panel 100 (or the current amount flowing through the first transistor TR1) may increase identically to an increase rate between the first temperature T1 and the second temperature T2 even between 0° C. and the first temperature T1, and after the second temperature T2, the current amount of the display panel 100 (or the current amount flowing through the first transistor TR1) may be maintained as the second current amount I2 of the predetermined size.

FIGS. 9A to 9C are referred to for describing the efficiency characteristic of the pixels PX. In FIG. 9A, an efficiency corresponding to the first sub pixel SPX1 emitting red light is shown, In FIG. 9B, an efficiency corresponding to the second sub pixel SPX2 emitting green light is shown, and in FIG. 9C, an efficiency corresponding to the third sub pixel SPX3 emitting blue light is shown. In this case, as the efficiency with respect to the same supply current increases, the luminance emitted by the pixels PX may increase. In addition, the efficiency characteristic of the pixels PX for each temperature may be due to the first and second quantum dots LT12 and LT22 included in the first and second sub pixels SPX1 and SPX2 described above with reference to FIG. 3A.

Referring to FIG. 9A, as the temperature of the display panel 100 increases within a predetermined temperature range, the efficiency of the first sub pixel SPX1 may decrease. In other words, when the temperature of the display panel 100 increases within the predetermined temperature range, the luminance of the first sub pixel SPX1 may decrease with respect to the same supply current.

For example, when the temperature of the display panel 100 increases within a range of the first temperature T1 (that is, the room temperature) and the second temperature T2, the efficiency of the first sub pixel SPX1 may linearly decrease from a (1-1)-th efficiency value R1 to a (2-1)-th efficiency value R2 less than the (1-1)-th efficiency value R1. The efficiency of the first sub pixel SPX1 may maintain the (1-1)-th efficiency value R1 between 0° C. and the first temperature T1, and maintain a (2-1)-th efficiency value R2 to be constant at the second temperature T2 or higher.

Referring to FIG. 9B, as the temperature of the display panel 100 increases within the predetermined temperature range, the efficiency of the second sub pixel SPX2 may increase. In other words, when the temperature of the display panel 100 increases within the predetermined temperature range, the luminance of the second sub pixel SPX2 may increase with respect to the same supply current.

For example, when the temperature of the display panel 100 increases within the range of the first temperature T1 (that is, the room temperature) and the second temperature T2, the efficiency of the second sub pixel SPX2 may linearly increase from a (1-2)-th efficiency value G1 to a (2-2)-th efficiency value G2 greater than the (1-2)-th efficiency value G1. The efficiency of the second sub pixel SPX2 may maintain the (1-2)-th efficiency value G1 between 0° C. and the first temperature T1, and maintain the (2-2)-th efficiency value G2 to be constant at the second temperature T2 or higher.

Referring to FIG. 9C, the efficiency of the third sub pixel SPX3 may be maintained to be constant regardless of the temperature change of the display panel 100. In other words, regardless of the temperature change of the display panel 100, the luminance of the third sub pixel SPX3 may be maintained to be constant with respect to the same supply current.

For example, the efficiency of the first sub pixel SPX1 may be maintained to be constant at a (2-3)-th efficiency value B1 regardless of the temperature of the display panel 100.

This is because the third sub pixel SPX3 does not include the quantum dots LT12 and LT22 differently from the first and second sub pixels SPX1 and SPX2, and thus is not affected by the temperature change of the display panel 100, as shown in FIG. 3A.

Referring to FIGS. 9A to 9C, the efficiency of the third sub pixel SPX3 may be maintained to be constant regardless of the temperature change of the display panel 100, but an efficiency decrease rate of the first sub pixel SPX1 may be greater than an efficiency increase rate of the second sub pixel SPX2. As a result, when the target current calculator 730 does not consider the efficiency characteristic of the pixels PX in calculating the target current value, when the temperature of the display panel 100 changes, the luminance of the display panel 100, which is a sum of luminance of the first to third sub pixels SPX1, SPX2, and SPX3, may change. That is, when the temperature of the display panel 100 increases, the luminance of the display panel 100 may decrease.

FIG. 10 is referred to for describing the first weight data W1 according to the current characteristic of the pixels PX for each temperature. Referring to FIG. 10, the first weight data W1 may correspond to the current characteristic of the pixels PX.

As described above with reference to FIG. 8, the current amount of the display panel 100 (or the current amount flowing in the first transistor TR1) may linearly increase between 0° C. and the second temperature T2 (for example, 100° C.) in proportion to the temperature of the display panel 100, and after the second temperature T2, the current amount of the display panel 100 (or the current amount flowing in the first transistor TR1) may be maintained as the current amount I2 of the predetermined size.

As the temperature of the display panel 100 increases within the predetermined temperature range (for example, 0° C. to 100° C.), the current amount flowing through the pixels PX increases, and thus the luminance of the display panel 100 may increase. Accordingly, as the temperature of the display panel 100 increases within the predetermined temperature range, the first weight data W1 may decrease.

For example, the first weight data W1 may have a value of 1 at the first temperature T1 (for example, 25° C.) and may have a value of 0.8 at the second temperature T2 (for example, 100° C.). When a current temperature T has an intermediate value (for example, 62.5° C.) between the first temperature T1 and the second temperature T2, the first weight data W1 may have a value of 0.9. However, the above-described first weight data W1 is an example value for convenience of description, and is not limited thereto. The first weight data W1 may be stored in a second memory M2 in a form of a second lookup table LUT2 or within the second lookup table LUT2.

FIGS. 11A to 11C are referred to for describing the second weight data according to the efficiency characteristic of the pixels PX for each temperature. Referring to FIGS. 11A to 11C, the second weight data may correspond to efficiency characteristic of the pixels PX. In this case, the second weight data W21, W22, and W23 may include (2-1)-th weight data W21 corresponding to the first sub pixel SPX1, (2-2)-th weight data W22 corresponding to the second sub pixel SPX2, and (2-3)-th weight data W23 corresponding to the third sub pixel SPX3.

As described above with reference to FIG. 9A, when the temperature of the display panel 100 increases within the range from the first temperature T1 (that is, the room temperature) to the second temperature T2, the efficiency of the first sub pixel SPX1 may linearly decrease from the (1-1)-th efficiency value R1 to the (2-1)-th efficiency value R2 less than the (1-1)-th efficiency value R1. The efficiency of the first sub pixel SPX1 may maintain the (1-1)-th efficiency value R1 between 0° C. and the first temperature T1, and maintain the (2-1)-th efficiency value R2 to be constant at the second temperature T2 or higher.

Referring to FIG. 11A, as the temperature of the display panel 100 increases within the predetermined temperature range (for example, T1 to T2), the efficiency of the first sub pixel SPX1 decreases, and thus the luminance of the first sub pixel SPX1 may decrease. Accordingly, as the temperature of the display panel 100 increases within the predetermined temperature range, the (2-1)-th weight data W21 may increase. In addition, the (2-1)-th weight data W21 may maintain a constant value in each of a period between 0° C. and the first temperature T1 and in a period of the second temperature T2 or higher.

For example, the (2-1)-th weight data W21 may have a value of 1 at the first temperature T1 (for example: 25° C.) and may have a value of 1.4 at the second temperature T2 (for example: 100° C.). When the current temperature T has the intermediate value between the first temperature T1 and the second temperature T2 (for example, 62.5° C.), the (2-1)-th weight data W21 may have a value of 1.2. In addition, the (2-1)-th weight data W21 may have a value of 1 between 0° C. and the first temperature T1, and may maintain the value of 1.4 at the second temperature T2 or higher. However, the above-described (2-1)-th weight data W21 is an example value for convenience of description, and is not limited thereto.

As described above with reference to FIG. 9B, when the temperature of the display panel 100 increases within the range from the first temperature T1 (that is, the room temperature) to the second temperature T2, the efficiency of the second sub pixel SPX2 may linearly decrease from the (1-2)-th efficiency value G1 to the (2-2)-th efficiency value G2 greater than the (1-2)-th efficiency value G1. The efficiency of the second sub pixel SPX2 may maintain the (1-2)-th efficiency value G1 between 0° C. and the first temperature T1, and maintain as the (2-2)-th efficiency value G2 to be constant at the second temperature T2 or higher.

Referring to FIG. 11B, as the temperature of the display panel 100 increases within the predetermined temperature range (for example, T1 to T2), the efficiency of the second sub pixel SPX2 increases, and thus the luminance of the second sub pixel SPX2 may increase. Accordingly, as the temperature of the display panel 100 increases within the predetermined temperature range, the (2-2)-th weight data W22 may decrease. In addition, the (2-2)-th weight data W22 may maintain a constant value in each of the period between 0° C. and the first temperature T1 and in the period of the second temperature T2 or higher.

For example, the (2-2)-th weight data W22 may have a value of 1 at the first temperature T1 (for example: 25° C.) and may have a value of 0.9 at the second temperature T2 (for example: 100° C.). When the current temperature T has the intermediate value between the first temperature T1 and the second temperature T2 (for example, 62.5° C.), the (2-2)-th weight data W22 may have a value of 0.95. In addition, the (2-2)-th weight data W22 may have a value of 1 between 0° C. and the first temperature T1, and may maintain the value of 0.9 at the second temperature T2 or higher. However, the above-described (2-2)-th weight data W22 is an example value for convenience of description, and is not limited thereto.

As described above with reference to FIG. 9C, the efficiency of the third sub pixel SPX3 may maintain a constant value regardless of the temperature change of the display panel 100.

Referring to FIG. 11C, accordingly, regardless of the temperature change of the display panel 100, the (2-3)-th weight data W23 may maintain a constant value. For example, the (2-3)-th weight data W23 may have a value of 1 regardless of the temperature change of the display panel 100. That is, the (2-3)-th weight data W23 may have the value of 1 at the first temperature T1, the second temperature T2, and the current temperature T.

The (2-1)-th weight data W21, the (2-2)-th weight data W22, and the (2-3)-th weight data W23 may be stored in a third memory M3 in a form of a third lookup table LUT3.

When it is determined that a change occurs in the ambient temperature of the display panel 100, based on the temperature data BT for each block received from the temperature calculator 720, the target current calculator 730 may calculate a correction frame load value, based on the load value BLV for each block and the load value ratio BLR for each block received from the load calculator 710, the first weight data W1 received from second memory M2, and the second weight data W21, W22, and W23 received from third memory M3. For example, the target current calculator 730 may calculate the correction frame load value using Equation 1 below.

Correction frame load value=(IDATA_$RGV*W$1+
IDATA_$RGV*W$21)/2+(IDATA_$GGV*W$1+
IDATA_$GGV*W$22)/2+(IDATA_$BGV*W$1+
IDATA_$BGV*W$23)/2   [Equation 1]

In Equation 1, IDATA_RGV is the frame load value for the first sub pixel SPX1 of the input image data IDATA, IDATA_GGV is the frame load value for the second sub pixel SPX2 of the input image data IDATA, IDATA_BGV is the frame load value for the third sub pixel SPX3 of the input image data IDATA, W1 is the first weight data, W21 is the (2-1)-th weight data, W22 is the (2-2)-th weight data, and W23 is the (2-3)-th weight data.)

For example, referring to the embodiment shown in FIGS. 10 and 11A to 11C, when the current temperature T of the display panel 100 is 62.5° C., the first weight data W1 may have a value of 1.2, the (2-2)-th weight data W22 may have a value of 0.95, and the (2-3)-th weight data W23 may have a value of 1. In this case, the correction frame load value may be (IDATA_RGV*0.9+IDATA_RGV*1.2)/2+ (IDATA_GGV*0.9+IDATA_GGV*0.95)/2+ (IDATA_BGV*0.9+IDATA_BGV*1)/2.

The target current calculator 730 may determine the final target current value FTC (or the second target current value) based on the unit target current value UTC received from the first memory M1 and the calculated correction frame load value. For example, the target current calculator 730 may determine the final target current value FTC (or the second target current value) by multiplying the unit target current value UTC and the correction frame load value.

The scale factor generator 750 may generate the scale factor SF by comparing the final target current value FTC (or the second target current value) received from the target current calculator 730 and the global current value GC received from the current measurer 740. For example, the scale factor generator 750 may determine a ratio between the final target current value FTC (or the second target current value) and the global current value GC as the scale factor SF. In an embodiment, the scale factor SF is generated by dividing the final target current value FTC by the global current value GC.

As described with reference to FIGS. 1 and 3A to 11C, the display device 1000 (or the scale factor provider 700) according to an embodiment of the disclosure performs the GCM operation in consideration of the current characteristic of the pixels PX according to the ambient temperature and the efficiency characteristic of the pixels PX according to the ambient temperature. Accordingly, even though the temperature of the display panel 100 changes, the display device 1000 may maintain a constant luminance.

The foregoing description merely shows and describes embodiments of the disclosure. The disclosure may be used in various other combinations, modifications, and environments, and the disclosure may be changed or modified within the scope of the concept of the disclosure disclosed in this specification, a scope equivalent to the disclosed disclosure, and/or according to ordinary skill in the art. Accordingly, the detailed description of the disclosure is not intended to limit the disclosure to the disclosed embodiments.

What is claimed is:

1. A display device comprising:
a display panel including a plurality of pixels and partitioned into a plurality of blocks including at least one of the pixels;
a timing controller configured to receive input image data from an outside source and generate scaled image data by scaling the input image data using a scale factor;
a data driver configured to generate a data signal corresponding to the scaled image data and supply the data signal to the pixels; and
a first logic circuit configured to measure a current flowing through the pixels to generate a global current value, to generate a load value for each of the blocks based on the input image data, to generate a target current value based on the load value for each of the blocks, first weight data including a first weight for a current characteristic of the pixels corresponding to a temperature of the display panel, and second weight data including a second weight for an efficiency characteristic of the pixels corresponding to the temperature, and to determine the scale factor based on the global current value and the target current value.

2. The display device according to claim 1, wherein the first logic circuit comprises:
a current sensor configured to measure the current flowing through the pixels to generate the global current value;
a first calculator configured to generate a unit target current value based on the global current value corresponding to a reference block among the blocks;
a second calculator configured to generate the load value for each of the blocks, based on the input image data;
a third calculator configured to generate temperature data for each block of the blocks, based on the load value for each block;
a fourth calculator configured to calculate a frame load value based on the load value for each block, the first weight data, and the second weight data, and to generate the target current value based on the frame load value and the unit target current value; and
a second logic circuit configured to calculate the scale factor by comparing the target current value and the global current value.

3. The display device according to claim 2, wherein the scale factor is a ratio between the target current value and the global current.

4. The display device according to claim 2, wherein each of the pixels includes a first sub pixel emitting light in a first color, a second sub pixel emitting light in a second color, and a third sub pixel emitting light in a third color.

5. The display device according to claim 4, wherein the first sub pixel includes a light emitting diode emitting light in the third color, and a first wavelength conversion pattern that converts the light of the third color into the light of the first color, the second sub pixel includes a light emitting diode emitting light in the third color, and a second wavelength conversion pattern that converts the light of the third color into the light of the second color, and the third sub pixel includes a light emitting diode emitting light in the third color, and a light transmission pattern that allows the light of the third color to transmit.

6. The display device according to claim 5, wherein the first color is red, the second color is green, and the third color is blue, the first wavelength conversion pattern includes a first quantum dot, and the second wavelength conversion pattern includes a second quantum dot having a size less than a size of the first quantum dot.

7. The display device according to claim 6, wherein the first quantum dot and the second quantum dot are semiconductor nano crystalline materials including any one of IV group nano crystal, II-VI group compound nano crystal, III-V group compound nano crystal, and IV-VI group nano crystal, or a combination thereof.

8. The display device according to claim 6, wherein the first wavelength conversion pattern, the second wavelength conversion pattern, and the light transmission pattern further include a scattering body that scatters the transmitted light.

9. The display device according to claim 4, wherein the first logic circuit further comprises at least one of:
a fifth calculator configured to generate a maximum grayscale value for each of the first sub pixel, the second sub pixel, and the third sub pixel included in each of the blocks based on the input image data; and
a sixth calculator configured to calculate a life of the display panel to generate life data.

10. The display device according to claim 9, further comprising: a temperature sensor configured to measure an ambient temperature of the display panel to generate the temperature data.

11. The display device according to claim 10, wherein the third calculator generates the temperature data for each block, based on the load value for each block, and at least one of the maximum grayscale value for each block, the temperature data, and the life data.

12. The display device according to claim 4, wherein the fourth calculator receives the first weight data from a second lookup table in which a first weight for a current characteristic of the pixels corresponding to a temperature of the display panel is stored, and receives the second weight data from a third lookup table in which a second weight for an efficiency characteristic of the pixels corresponding to the temperature of the display panel is stored.

13. The display device according to claim 12, wherein the first weight has a value of 1 at a first temperature, and a value linearly decreasing from the first temperature to a preset second temperature higher than the first temperature.

14. The display device according to claim 12, wherein the second weight data includes third weight data for the first sub pixel, fourth weight data for the second sub pixel, and fifth weight data for the third sub pixel, the third weight data has a value of 1 at a first temperature and a value linearly increasing from the first temperature to the second temperature, the fourth weight data has a value of 1 at the first temperature and a value linearly decreasing from the first temperature to the second temperature, and the weight data is 1.

15. The display device according to claim 14, wherein an increase rate of the third weight data is greater than a decrease rate of the fourth weight data.

16. The display device according to claim 14, wherein the frame load value=(IDATA_RGV*W1+IDATA_RGV*W21)/2+(IDATA_GGV*W1+IDATA_GGV*W22)/2+(IDATA_BGV*W1+IDATA_BGV*W23)/2, IDATA_RGV is a first sub pixel load value of the input image data, IDATA_GGV is a second sub pixel load value of the input image data, IDATA_BGV is a third sub pixel load value of the input image data, W1 is the first weight data, W21 is the third weight data, W22 is the fourth weight data, and W23 is the fifth weight data.

17. A method of driving a display device comprising a display panel including a plurality of pixels and partitioned into a plurality of blocks including at least one of the pixels, a timing controller configured to receive input image data from an outside source and generate scaled image data by scaling the input image data using a scale factor, and a data driver configured to generate a data signal corresponding to the scaled image data and supply the data signal to the pixels, the method comprising:
measuring a current flowing through the pixels to generate a global current value;
generating a unit target current value based on the global current value corresponding to a reference block among the blocks;
generating a load value for each of the blocks, based on the input image data;
generating temperature data for each of the blocks, based on the load value for each block;
calculating a frame load value based on the load value for each block, first weight data, and second weight data;
generating a target current value based on the frame load value and the unit target current value; and
calculating the scale factor by comparing the target current value and the global current value.

18. The method according to claim 17, wherein each of the pixels includes a first sub pixel emitting light in a first color, a second sub pixel emitting light in a second color, and a third sub pixel emitting light in a third color.

19. The method according to claim 18, wherein generating the temperature data for each block further comprises at least one of: generating a maximum grayscale value for each of the first sub pixel, the second sub pixel, and the third sub pixel included in each of the blocks based on the input image data; generating temperature data by measuring an ambient temperature of the display panel; and calculating a life of the display panel to generate life data.

20. The method according to claim 18, wherein the frame load value=(IDATA_RGV*W1+IDATA_RGV*W21)/2+(IDATA_GGV*W1+IDATA_GGV*W22)/2+(IDATA_BGV*W1+IDATA_BGV*W23)/2, IDATA_RGV is a first sub pixel load value of the input image data, IDATA_GGV is a second sub pixel load value of the input image data, IDATA_BGV is a third sub pixel load value of the input image data, W1 is first weight data, W21 is second weight data, W22 is third weight data, and W23 is fourth weight data.

21. A display device comprising:
a display panel including a plurality of pixels;
a timing controller configured to generate compensated image data obtained by compensating for a luminance change according to a temperature of the plurality of pixels, based on input image data received from an outside source; and
a data driver configured to generate a data signal corresponding to the compensated image data and supply the data signal to the pixels,
wherein each of the pixels includes a first sub pixel having a first quantum dot emitting light in a first color and a second sub pixel having a second quantum dot emitting light in a second other color,
wherein the timing controller determines a first load value of the first sub pixel and a second load value of the second sub pixel based on the input image data, generates a first value based on the first load value of the first sub pixel and a light emission efficiency characteristic of the first subpixel according to a temperature of the display panel, generates a second value based on the second load value of the second sub pixel and a light emission efficiency characteristic of the second sub pixel according to the temperature, and generates the compensated image data based on a sum of the first and second values,
wherein each of the pixels further includes a third sub pixel including a scattering body,
wherein in the first sub pixel, when the temperature increases between a first temperature and a preset second temperature higher than the first temperature, the luminance decreases according to the light emission efficiency characteristic according to the temperature of the first quantum dot, wherein in the second sub pixel, when the temperature increases between the first temperature and the second temperature, the luminance increases according to the light emission efficiency characteristic according to the temperature of the second quantum dot, and wherein in the third sub pixel, the luminance is maintained constant regardless of the temperature change between the first temperature and the second temperature.

22. The display device according to claim 21, wherein the display panel is divided into blocks including at least one of the pixels, and the timing controller calculates load values for each block for each of the first to third sub pixels, based on the input image data, and calculates the temperature for each of the first to third sub pixels, based on the load values for each block.

23. The display device according to claim 22, further comprising: a temperature sensor configured to measure the ambient temperature of the display panel to calculate the temperature.

24. The display device according to claim 22, wherein the timing controller generates the compensated image data based on a current characteristic according to a temperature of the pixels, and in the pixels, when the temperature of the pixels increases between the first temperature and the second temperature, the luminance increases according to the current characteristic.

25. The display device according to claim 24, wherein the timing controller assigns a first weight corresponding to the current characteristic and a second weight corresponding to the light emission efficiency characteristic according to the temperature of the first quantum dot to a sum of a load value for each block of the first sub pixels, assigns the first weight and a third weight corresponding to the light emission efficiency characteristic according to the temperature of the second quantum dot to a sum of a load value for each block of the second sub pixels, and assigns the first weight and a fourth weight to a sum of a load value for each block of the third sub pixels, to calculate a frame load value, and generates the compensated image data corresponding to the frame load value.

26. The display device according to claim 25, wherein the first weight has a value of 1 at the first temperature and a value linearly decreasing from the first temperature to the second temperature.

27. The display device according to claim 25, wherein the second weight has a value of 1 at the first temperature and a value linearly increasing from the first temperature to the second temperature, the third weight has a value of 1 at the first temperature and a value linearly decreasing from the first temperature to the second temperature, and the fourth weight is 1.

28. The display device according to claim 27, wherein an increase rate of the second weight is greater than a decrease rate of the third weight.

* * * * *